US012658229B2

(12) United States Patent
Zlotnik

(10) Patent No.: US 12,658,229 B2
(45) Date of Patent: Jun. 16, 2026

(54) CRITICAL TIMING DRIVEN ADAPTIVE VOLTAGE FREQUENCY SCALING

(71) Applicant: Micron Technology, Inc., Boise, ID (US)

(72) Inventor: Leon Zlotnik, Camino, CA (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 18/787,812

(22) Filed: Jul. 29, 2024

(65) Prior Publication Data

US 2025/0069632 A1     Feb. 27, 2025

Related U.S. Application Data

(60) Provisional application No. 63/578,761, filed on Aug. 25, 2023.

(51) Int. Cl.
*G11C 7/22* (2006.01)
*G11C 7/10* (2006.01)
(52) U.S. Cl.
CPC .............. *G11C 7/222* (2013.01); *G11C 7/106* (2013.01); *G11C 7/1069* (2013.01)
(58) Field of Classification Search
CPC ...................................... G11C 26/16
See application file for complete search history.

(56) References Cited

U.S. PATENT DOCUMENTS

| | | | |
|---|---|---|---|
| 9,405,355 B2 | 8/2016 | Bahirat | |
| 2022/0334181 A1* | 10/2022 | Poudel | .................. G11C 29/16 |
| 2024/0069783 A1 | 2/2024 | Roberts | |
| 2024/0078024 A1 | 3/2024 | Ge | |

\* cited by examiner

*Primary Examiner* — Jason Lappas
(74) *Attorney, Agent, or Firm* — Brooks, Cameron & Huebsch, PLLC

(57) ABSTRACT

An example method for critical timing driven adjustable voltage frequency scaling can include performing sensing operations on a system on chip (SoC) at a respective plurality of time windows each associated with a particular data value, comparing at least two of the particular data values associated with at least two respective time windows of the plurality of time windows, in response to the at least two of the particular data values being a same data value, determining that a clock margin is above a threshold clock margin, and determining that a clock margin is below a threshold clock margin. In some instance, in response to determining that the clock margin is above the threshold clock margin, a clocking of the SoC can be adjusted, a voltage of at least one operation of the SoC can be adjusted, and/or a clocking frequency of at least one operation of the SoC, among other possibilities.

20 Claims, 11 Drawing Sheets

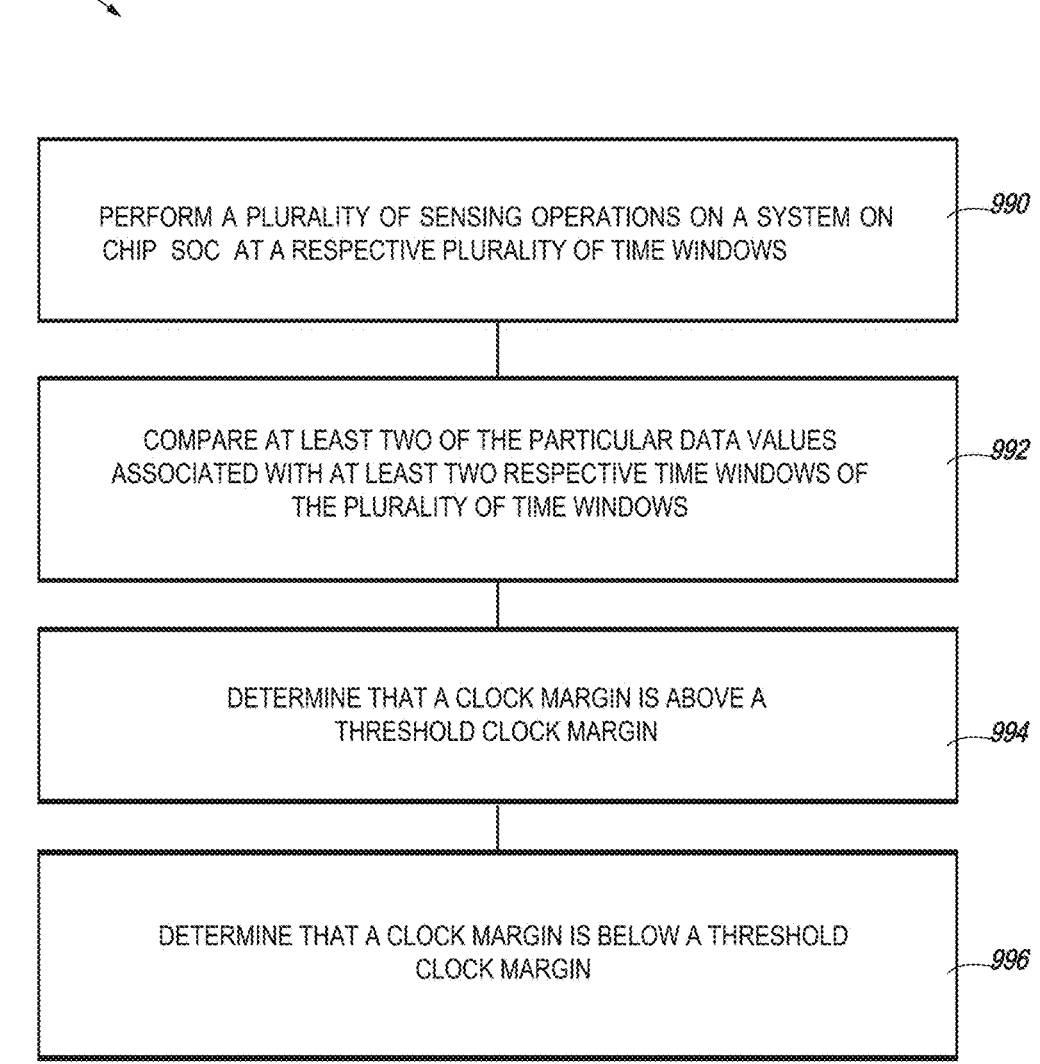

*909*

PERFORM A PLURALITY OF SENSING OPERATIONS ON A SYSTEM ON CHIP SOC AT A RESPECTIVE PLURALITY OF TIME WINDOWS — *990*

COMPARE AT LEAST TWO OF THE PARTICULAR DATA VALUES ASSOCIATED WITH AT LEAST TWO RESPECTIVE TIME WINDOWS OF THE PLURALITY OF TIME WINDOWS — *992*

DETERMINE THAT A CLOCK MARGIN IS ABOVE A THRESHOLD CLOCK MARGIN — *994*

DETERMINE THAT A CLOCK MARGIN IS BELOW A THRESHOLD CLOCK MARGIN — *996*

*FIG. 9*

CRITICAL TIMING DRIVEN ADAPTIVE VOLTAGE FREQUENCY SCALING

PRIORITY INFORMATION

This application claims the benefit of U.S. Provisional Application No. 63/578,761, filed on Aug. 25, 2023, the contents of which are incorporated herein by reference.

TECHNICAL FIELD

Embodiments of the disclosure relate generally to critical timing driven adaptive voltage frequency scaling (AVFS).

BACKGROUND

Various types of electronic devices such as digital logic circuits and memory systems may store and process data. A digital logic circuit is an electronic circuit that processes digital signals or binary information, which can take on two possible values (usually represented as 0 and 1). The digital logic circuit can use logic gates to manipulate and transform the digital signals or binary information. Digital logic circuits can be, for example, used in a wide range of electronic devices including computers, calculators, digital clocks, and many other electronic devices that employ digital processing. Digital logic circuits can be designed to perform specific logical operations on digital inputs to generate digital outputs, and, in some instances, can be combined to form more complex circuits to perform more complex operations. In general, the power supply, voltage control, and/or clock control can change a voltage or frequency during operation of the digital logic. A memory device can include one or more memory devices that store data. The memory devices can be, for example, non-volatile memory devices and volatile memory devices. In general, a host system can utilize a memory system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 9 illustrates an example method for critical timing driven adjustable voltage frequency scaling in accordance with some embodiments of the present disclosure.

DETAILED DESCRIPTION

Figure 1:
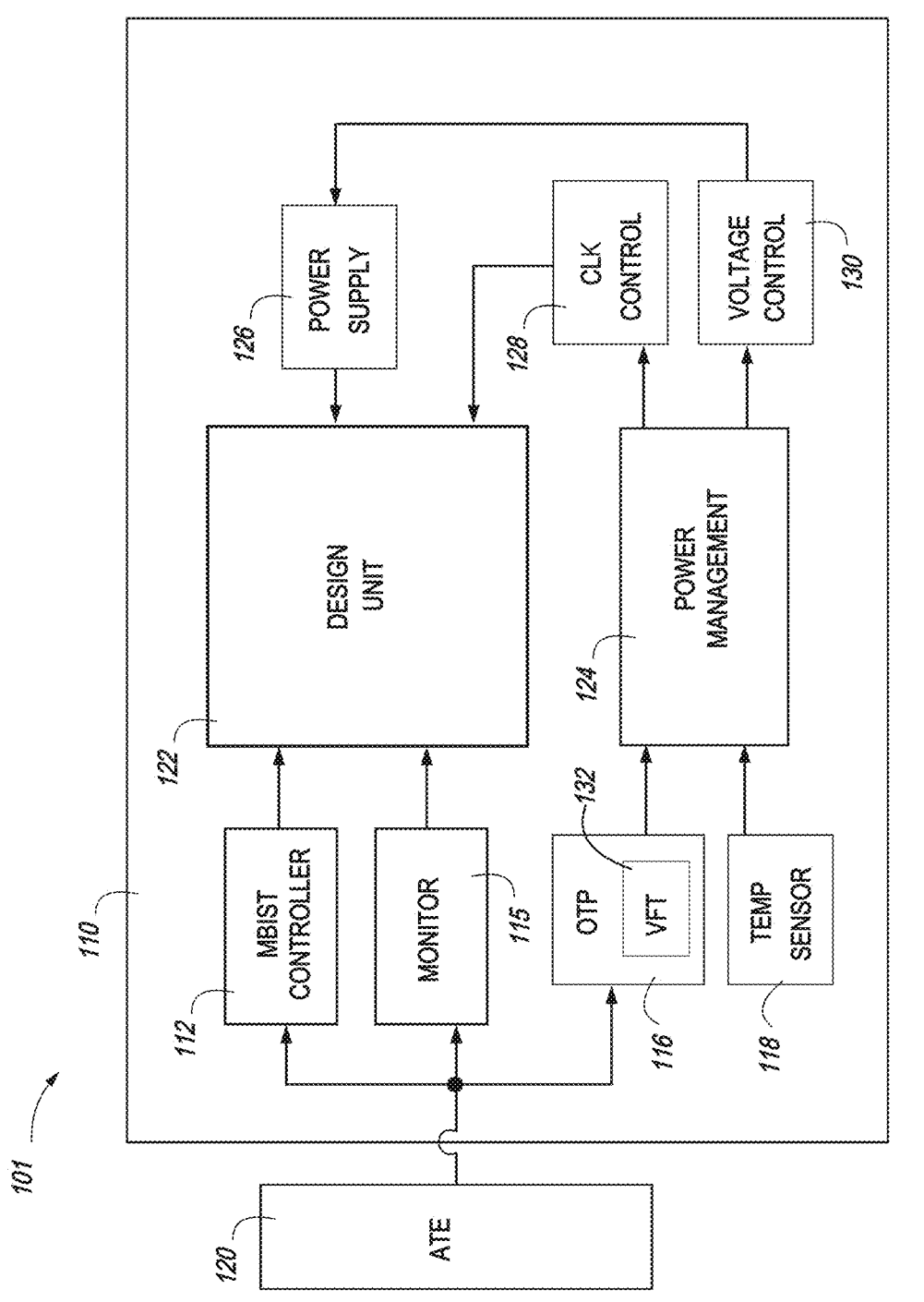
FIG. 1 illustrates an example system for critical timing driven adjustable voltage frequency scaling in accordance with some embodiments of the present disclosure.

Aspects of the present disclosure are directed to critical timing driven adaptive voltage frequency scaling (AVFS). As will be described below, a number of sensors can be used to monitor critical timing. The monitored time associated with the critical timing path of the circuit can be used to adjust the voltage and/or a frequency to ensure that the circuit functions as intended. As an example, the sensors can be set to an earlier or later arrival to determine a state of the data at a particular location within data storage elements, e.g., flip-flops, latches, etc., of a system on chip (SoC) prior to and/or subsequent to a functional critical endpoint where the data is actually being sampled from the location. In this way, the clock frequency can be adjusted to avoid excessive margins and still provide adequate margin to avoid errors. Clock margins, e.g., particularly clock margins above a threshold clock margin, can be used to ensure that accurate data is being sampled from the location. For example, a clock frequency of at least one operation of a SoC can be adjusted in response to determining that the clock margin is above the threshold clock margin. In one example, a voltage and/or a clocking frequency of at least one operation of the SoC can be adjusted in response to determining that the clock margin is above the threshold clock margin.

Voltage and frequency scaling (VFS) can be used to match system power consumption with desired performance. Workloads associated with a system (e.g., a computing system) can be monitored to determine a setting for voltage and clock speed and can configure the hardware of the system appropriately. Dynamic voltage and frequency scaling (DVFS) is a technique that aims at reducing the power consumption of a system or boosting the system performance by dynamically adjusting voltage and frequency of the system. This can exploit the fact that the system generally has a discrete frequency and voltage setting. Dynamic voltage scaling to increase voltage can be referred to as overvolting, whereas dynamic voltage scaling to decrease voltage can be referred to as undervolting. Undervolting can be performed in order to conserve power, particularly in laptops and other mobile devices, where energy comes from a battery and thus is limited, or, in rare cases, to increase reliability. Overvolting can be performed in order to support higher frequencies for performance. The term "overvolting" may also be used to refer to increasing static operating voltage of components to allow operation at higher speed (e.g., while overclocking).

The voltage and frequency applied to various components of the systems described herein can be dynamically adjusted based on the desired power and performance associated with the voltage, frequency, and/or temperature data (in addition to other parameters, if monitored) that is gathered during monitoring operations (e.g., an AC (or at-speed) scan operation, or other data gathering and/or monitoring operations), and/or by a dedicated, embedded monitor, a built-in self test (BIST), or some table compiled using modeling and/or characterization, among other approaches. The voltage, frequency, and/or temperature data of the monitoring operations (e.g., AC scans or other monitoring operations) can gather real-measured data for a large portion of the system and provide a more accurate approach to adjusting the voltage and frequency for scaling. As an example, real-measured data can refer to data that is not from simulation and is from an actual scan and not extrapolated. Accordingly, voltage frequency scaling can provide benefits in systems (e.g., application-specific integrated circuits (ASICs), field-programmable gate arrays (FPGAs), automated power management systems, etc.) that rely on instantaneous (or near-instantaneous) changes to the voltage, frequency, and temperature of the system where each parameter may affect one of the other parameters.

In some previous approaches, a clock frequency or period using an excessive margin (e.g., excessive clock margin) can be used in order to avoid incorrect data being sampled from a location in an SoC where an excessive clock margin refers to a slower clock or a clock with a longer period. As an example, if the clock period is long enough to cover the propagation time of the data from a start point (e.g., rising edge of a clock) to an end point (e.g., a rising edge of a subsequent clock) with some clock margin, then the data will be accurate when sampled. However, the excessive clock margin can affect system performance by introducing excessive time not necessary for providing accurate data. In contrast to these previous approaches, methods and systems as described herein seek to cure the deficiencies of the previous approaches and avoid such problems by using a number of sensors to sense the time for the data to be propagated to the location while still providing sufficient clock margin to ensure inaccurate data will not be sampled from the location. In addition, the number of sensors used can include enough sensors to determine whether a data violation has occurred and/or whether the location is inactive or may provide inaccurate data when sampled from the location.

FIG. 1 illustrates an example system 101 for critical timing driven adjustable frequency voltage scaling in accordance with some embodiments of the present disclosure. The system 101 can include an automatic testing equipment (ATE) component 120 and a system on chip (SoC) 110. A component, such as the ATE component 120 described herein, can include various circuitry to facilitate an operation associated with the component, e.g., testing a portion of an SoC (such as SoC 110). For example, the ATE component 120 can include special purpose circuitry in the form of an ASIC, FPGA, state machine, and/or other logic circuitry or software and/or firmware that can allow the ATE component 120 to test other components and/or parameters of the SoC 110. As an example, the ATE component 120 can be a simple computer-controlled digital multimeter, or a complicated system containing dozens or more complex test instruments (real or simulated electronic test equipment) capable of automatically testing and diagnosing faults in sophisticated electronic packaged parts or on wafer testing, including systems on chips and/or integrated circuits.

Further, the SoC 110 can be an application-specific-integrated circuit (ASIC), a field-programmable gate array (FPGA), etc. The SoC 110 includes a design unit 122 and a power management controller 124. The power management controller 124 can apply or determine whether to perform dynamic voltage frequency scaling (DVFS) operations using the one-time programmable (OTP) memory 116, the temperature sensor 118, and any other available inputs, as will be described below. The design unit 122 includes circuitry which can include one or more cores (e.g., "intellectual property (IP) cores"). As used herein, a "core" or "IP core" generally refers to one or more blocks of data and/or logic that form constituent components of an application-specific integrated circuit or field-programmable gate array. The "core(s)" or "IP core(s)" can be designed, built, and/or otherwise configured to perform specific tasks and/or functions within the systems described herein. In some examples, the power management controller 124 can be a power management integrated circuit (or PMIC) used for managing power of the system 101. Although PMIC can refer to a wide range of chips (or modules in system on a chip (SoC) devices), most include several DC/DC converters. A DC-to-DC converter is an electronic circuit or electromechanical device that converts a source of direct current (DC) from one voltage level to another. It is a type of electric power converter. A PMIC is often included in battery-operated devices such as mobile phones and portable media players to decrease the amount of space required.

The ATE component 120 communicates with the design unit 122 through an MBIST ("memory built-in self-test") controller 112 and/or a monitoring component 115. While an MBIST controller 112 is being described herein, embodiments are not so limited. For example, MBIST is just an example self-test controller/circuit and any number of self-test circuits can be used. The monitoring component 115 can refer to circuitry and/or control logic that is used to control and manage monitoring operations (such as an AC scan operation, among other monitoring operations), as will be described further below. MBIST can refer to the industry-standard method of testing embedded memories. MBIST operates by performing sequences of reads and writes according to a test algorithm. Many industry-standard test algorithms exist. An MBIST controller generates the correct sequence of reads and writes to all locations. In doing this, some additional test coverage is achieved in the address and data paths that the MBIST uses. In addition, the design unit 122 can communicate with the power management controller 124 through a clock ("CLK") control component 128 and a voltage control component 130 that is in communication with a power supply component 126 and communicates through the power supply component 126 to the design unit 122. The voltage control component 130 can control the voltage of the power supply component 126 according to instructions received from the power management controller 124. In some examples, the power management controller 124 can be a power management integrated circuitry (PMIC).

The clock control component 128 can include various circuitries and/or logic inserted on the SoC 110 for controlling clocks. The clock control component 128 can scale a clock timing according to instructions received from the power management controller 124. Further, since monitoring of AC (at-speed) testing generally requires two or more clock pulses in capture mode with a frequency equal or substantially close to the functional clock frequency, without the clock control component 128, the at-speed pulses related to the ATE component 120 may need to be provided through the input/output (I/O) pads of the SoC 110. However, these I/O pads can have limitations in terms of the maximum frequency they can support. The clock control component 128, on the other hand, can use, in some examples, an internal phase-lock-loop (PLL) clock for generating clock pulses for test and/or, in other examples, an internal delay-locked-loop (DLL) clock for generating the clock pulses for test. While the clock control component 128 is described as providing clocking for the ATE component 120 and also the clock according to instructions received from the power management controller 124, embodiments are not so limited. For example, the clock control component 128 can be used for scaling the frequency according to instructions from the power management controller 124 to dynamically adjust the frequency for DVF scaling and a different clock control component (not illustrated) can be used solely for the ATE component 120 and for clock timing of the ATE testing itself.

In some examples, the PLL clock can refer to circuitry and/or logic that generates an output signal whose phase is related to the phase of an input signal. Although there are several different types of PLL clock circuits, the simplest is an electronic circuit consisting of a variable frequency oscillator and a phase detector in a feedback loop. The oscillator generates a periodic signal, and the phase detector compares the phase of that signal with the phase of the input periodic signal, adjusting the oscillator to keep the phases matched. Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis.

In the other examples, the delay-locked-loop (DLL) can be a digital circuit similar to a phase-locked loop (PLL), with the main difference being the absence of an internal voltage-controlled oscillator, replaced by a delay line. A DLL can be used to change the phase of a clock signal (a signal with a periodic waveform), usually to enhance the clock rise-to-data output valid timing characteristics of integrated circuits (such as DRAM devices). DLLs can also be used for clock recovery (CDR). From the outside, a DLL can be seen as a negative-delay gate placed in the clock path of a digital circuit. The main component of a DLL can be a delay chain composed of many delay gates connected output-to-input. The input of the chain (and thus of the DLL) is connected to the clock that is to be negatively delayed. A multiplexer can be connected to each stage of the delay chain and the selector of this multiplexer can be automatically updated by a control circuit to produce the negative delay effect. The output of the DLL can be the resulting, negatively delayed clock signal.

Phase-locked loops can be widely employed in radio, telecommunications, computers, and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can now provide a complete phase-locked-loop building block, the technique can be widely used in modern electronic devices, with output frequencies from a fraction of a hertz up to many gigahertz. Further, while phase-locked-loops (PLLs) and delay-locked-loops (DLLs) are provided in these examples, embodiments are not so limited. For example, any circuit capable of generating the clock or changes in frequency can be used.

In the instance DC (stuck-at) testing the clock control component 128 can ensure that only one clock pulse is generated in the capture phase. Similarly, during AC (at-speed) testing the clock control component 128 ensures two or more clock pulses are generated in the capture phase, having a frequency equal to the frequency of the functional clock. Therefore, test clocks used in a scan design can be routed through the clock control component 128, which controls the clock operation in the scan mode (both in stuck-at and at-speed testing) and bypasses the functional clock in a functional mode.

Generally, an AC scan is configured to detect an at-speed fault and a DC scan is configured to detect a stuck-on fault. An AC scan detects manufacturing defects that behave as delays on gate input-output ports. So, in an AC scan, each port is tested for logic 0-to-1 transition delay (slow-to-rise fault) or logic 1-to-0 transition delay (slow-to-fall fault). Like stuck-at faults, the at-speed fault can be at the input or output of a gate, thus a simple 2-input AND gate has six possible at-speed faults. As an example, suppose a slow-to-fall fault is occurring at the output of an AND gate. A slower 1-to-0 transition at the output of the AND gate may occur and can affect the value captured. It is important to note that only with an initial state '1' in a flop and 010 at the input will the at-speed fault be able to be detected.

Referring back to the DC (stuck-at) scan, the DC scan models manufacturing defects which occur when a circuit node is shorted to a positive supply voltage or "VDD" (stuck-at-1 fault) or a ground voltage "GND" (stuck-at-0 fault) permanently. The fault can be at the input or output of a gate. Thus, a simple 2-input AND gate has six possible stuck-at faults. As an example, suppose a stuck-at-0 fault is at the output of an AND gate. Note one important thing for this example, there are three input ports in the circuit, thus, there can be a combination of eight different inputs or patterns {000, 001, 010, 011, 100, 101, 110, 111}; out of the eight patterns, only one pattern {011} will be able to detect this fault. As with the rest of the patterns, the expected output can be the same as the actual circuit output in the presence of this stuck-at-0 fault. As this is a small circuit in this example, the pattern can be easily found that detects this fault. However, more complicated circuits will use more complicated stuck-at-0 fault patterns to test all the possible fault locations using complex steps and are contemplated withing the scope of the disclosure.

Further, in this example illustrated in FIG. 1, the ATE component 120 can configure the power management controller 124 through a one-time-programmable ("OTP") memory 116. However, embodiments are not so limited and the power management controller 124 can be configured through other methods or components. For example, a programmable component that is not a one-time programmable component, such as a memory that can be programmed multiple times or more than once, can be used. A one-time-programmable memory (OTP) can refer to a particular type of non-volatile memory (NVM) that permits data to be written to memory only once. Once the memory has been programmed, it retains its value upon loss of power (i.e., is non-volatile). OTP memory can be used in applications where reliable and repeatable reading of data is required. Examples include boot code, encryption keys, and configuration parameters for analog, sensor, or display circuitry. OTP NVM is characterized, over other types of NVM like electronic fuse (cFuse) or electrically-erasable programmable read only memory (EEPROM), by offering a low power, small area footprint memory structure. As such, OTP memory can be used in microprocessors, display drivers, and Power Management ICs (PMICs).

The OTP memory 116 can include a voltage-frequency-temperature table ("VFT") 132. The VFT table 132 can be a group of cells used to store data related to performance of an AC scan operation and/or data related to performance of a memory built-in self-test (MBIST) operation. As an example, the monitoring operation (e.g., AC scan or other monitoring operations) can be performed by the monitor component 115 (or, in the example of an AC scan, an AC scan controller such as AC scan controller 214 in FIGS. 2A-2B) and the data generated from the monitor operation (e.g., AC scan) and associated with parameters such as voltage (V), frequency (F), temperature (T), etc., and can be stored in the VFT table 132. The stored data in the VFT table 132 can be used to determine a particular frequency and/or voltage to use in the SoC 110 based on an error rate and/or quantity of errors that occur at a particular frequency, temperature and/or voltage. While, in some embodiments, a monitor operation can occur at a time of manufacturing and prior to use by a user, a monitor operation can be performed at different time windows throughout a life cycle of the system 101 and/or SoC 110. For example, at a particular period of time post-manufacturing or post-use by the user, a monitor operation can be performed at boot-up of the SoC 110. The data associated with the frequency and/or voltage and/or temperature and corresponding error rates and/or error quantities may have changed from the initial monitor operation or several initial monitor operations associated with a time of manufacturing. This can be due to effects of age on the cells that can cause the frequency, voltage, and/or temperatures to alter the efficacy and/or accuracy of data stored in the cells over time. Accordingly, adjusted data based on such post-manufacturing scans can be stored in a register and/or in a particular location within the SoC 110 and can be used to modify how the VFT table 132 is being used to adjust the voltage and/or frequency and/or temperature values of the SoC 110.

Further, a temperature sensor 118 can be in communication with the power management controller 124 and can provide temperature data to the power management controller 124. The temperature sensor 118 can be embedded within the SoC 110 and can provide a temperature value at a number of different locations within the SoC 110. For example, the temperature sensor 118 can be embedded near a power transistor(s) that is near a heat source of the SoC 110. While one temperature sensor 118 is described, embodiments are not so limited. As an example, any number of temperature sensors can be located throughout the SoC 110, such as close to specific heat-dissipating transistors, near the power supply component 126, etc.

In some embodiments, the system 101 can be deployed on, or otherwise included in a system (e.g., a storage device, a memory module, or a hybrid of a storage device and memory module). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

In other embodiments, the system 101 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Such computing devices can include a host system that is coupled to a memory system (e.g., one or more storage devices, memory modules, or a hybrid of a storage device and memory module). A host system can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system uses the storage device, the memory module, or a hybrid of the storage device and the memory module, for example, to write data to the storage device, the memory module, or the hybrid of a storage device and memory module and read data from the storage device, the memory module, or the hybrid of a storage device and memory module.

In these examples, the host system can include a processing unit such as a central processing unit (CPU) that is configured to execute an operating system. In some embodiments, the processing unit can execute a complex instruction set computer architecture, such an x86 or other architecture suitable for use as a CPU for a host system.

A host system can be coupled to a memory system via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system and the memory system. The host system can further utilize an NVM Express (NVMe) interface to access components when the memory system is coupled with the host system by the PCIe interface. The physical host interface can provide an interface for passing control, address, data, and other signals between the memory system and the host system. In general, the host system can access multiple memory sub-systems via a same communication connection, multiple separate communication connections, and/or a combination of communication connections.

A system can include any combination of the different types of non-volatile memory devices and/or volatile memory devices. The volatile memory devices can be, but are not limited to, random access memory (RAM), such as dynamic random-access memory (DRAM) and synchronous dynamic random access memory (SDRAM).

Some examples of non-volatile memory devices include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as three-dimensional cross-point arrays of non-volatile memory cells and NAND type memory (e.g., 2D NAND, 3D NAND) are described, the memory device can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory system can also include additional circuitry or components. In some embodiments, a memory system can include a cache or buffer (e.g., DRAM) and address circuitry (e.g., a row decoder and a column decoder) that can receive an address from the memory system controller and decode the address to access the memory device(s).

In some embodiments, memory devices can include local media controllers that operate in conjunction with a memory system controller to execute operations on one or more memory cells of the memory devices. For example, an external controller can externally manage the memory device (e.g., perform media management operations on the memory device). In some embodiments, a memory device is a managed memory device, which is a raw memory device combined with a local controller for media management within the same memory device package. An example of a managed memory device is a managed NAND (MNAND) device.

Although non-limiting examples herein are generally described in terms of applicability to memory systems and/or to memory devices, embodiments are not so limited, and aspects of the present disclosure can be applied as well to a system-on-a-chip, a computing system, data collection and processing, storage, networking, communication, power, artificial intelligence, control, telemetry, sensing and monitoring, digital entertainment and other types of systems and/or devices, Accordingly, aspects of the present disclosure can be applied to these components in order to provide critical timing driven AVFS, as described herein.

Figure 2A:
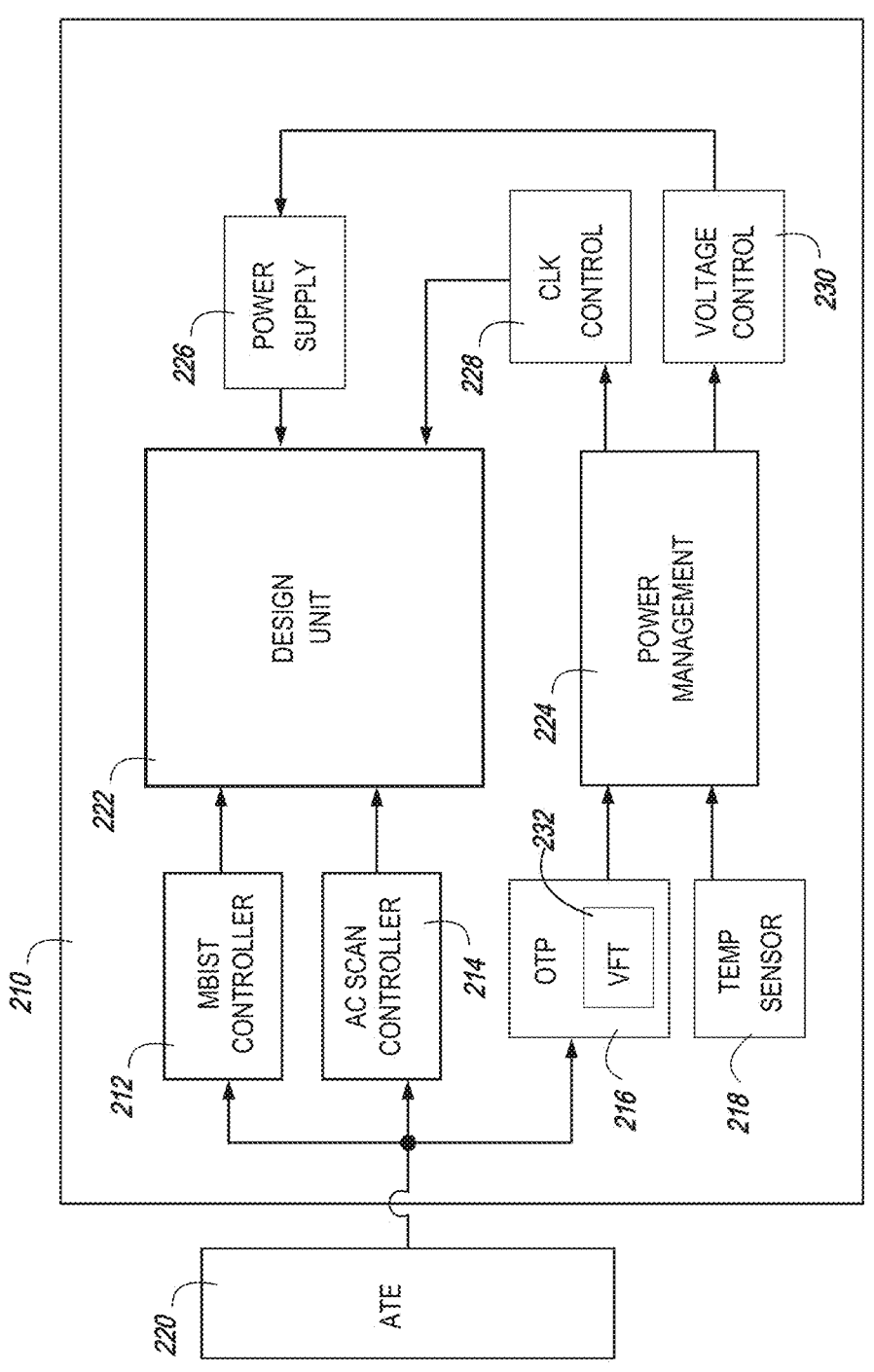
FIGS. 2A-2B each illustrate an example system for critical timing driven adjustable voltage frequency scaling in accordance with some embodiments of the present disclosure.

FIG. 2A illustrates an example system for critical timing driven adjustable frequency voltage scaling in accordance with some embodiments of the present disclosure. Similar to FIG. 1, FIG. 2A can include the same and/or similar components. For example, FIG. 2A illustrates an ATE 220 that is similar to ATE component 120 in FIG. 1 and a system-on-chip (SoC) 210 similar to SoC 110 in FIG. 1. The ATE 220 can communicate with the SoC 210. The SoC 210 can include a design unit 222. The ATE 220 can communicate with the design unit 222. For instance, the ATE 220 can communicate with the design unit 222 through an MBIST controller 212. The ATE 220 can configure the SoC 210. The SoC 210 can include a power management controller 224. The ATE 220 can communicate with the power management controller 224. For instance, the ATE 220 can communicate with the power management controller 224 through an OTP memory 216. The ATE 220 can control the design unit 222 through a clock control component 228, a voltage control component 230 and a power supply 226. A temperature sensor 218 may be in communication with the power management controller 224. However, a distinction from FIG. 1 that is illustrated in FIG. 2A is that instead of the monitor component 115, an AC scan controller 214 is illustrated for more specific performance of AC scan operations, which is a subset of the overall monitoring operations described above.

Figure 2B:
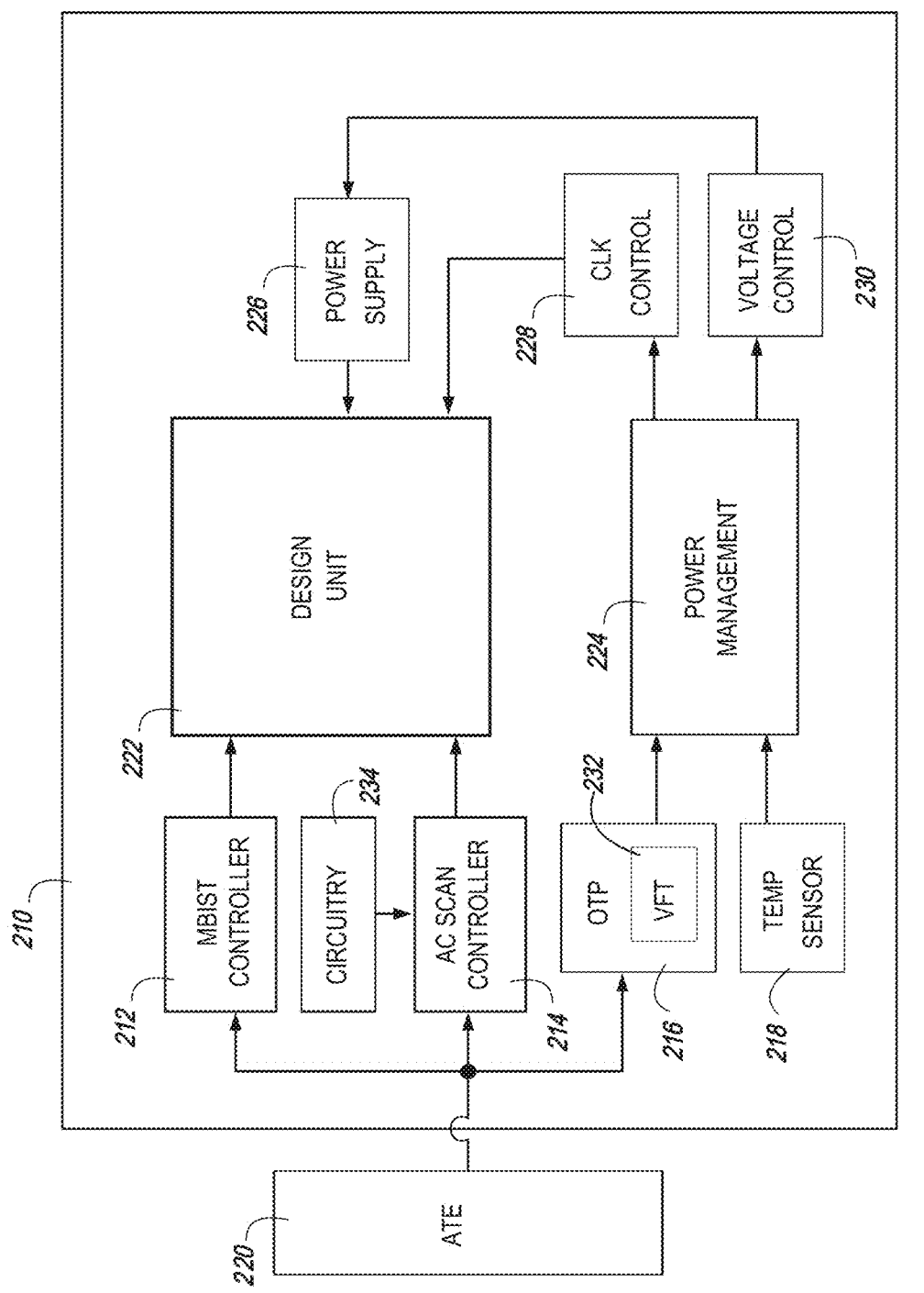

FIG. 2B illustrates an example system for critical timing driven frequency voltage scaling in accordance with some embodiments of the present disclosure. Similar to FIG. 1 and FIG. 2A, FIG. 2B can include the same and/or similar components. For example, FIG. 2B illustrates an ATE 220 that is similar to ATE component 120 in FIG. 1 and a system-on-chip (SoC) 210 similar to SoC 110 in FIG. 1. The SoC 210 can include a design unit 222 that is controlled by the ATE 220 through an MBIST controller 212 and an AC scan controller 214 (similar to FIG. 2A). The SoC 210 can also include a power management controller 224 that is configured by the ATE 220 through an OTP 216 and can control the clock control component 228, a voltage control component 230 and a power supply 226. A temperature sensor 218 may be in communication with the power management controller 224.

However, a distinction from FIG. 1 and FIG. 2A that is illustrated in FIG. 2B is circuitry 234 in communication with the AC scan controller 214. The circuitry 234 can be, for example, circuitry associated with a non-volatile memory device such as, in some examples, a NAND flash memory array. As an additional example, a memory array can be a storage class memory (SCM) array or other such memory arrays, such as, for instance, a three-dimensional cross-point (3D Cross-point) memory array, a ferroelectric RAM (FRAM) array, or a resistance variable memory array such as a PCRAM, RRAM, or spin torque transfer (STT) array, among others. The circuitry 234 can be used to store scan vectors or other testing program data that the AC scan controller 214 can run autonomously without the ATE 220. Further, for example, an AC scan performed during a lifecycle of the SoC 110, 210, as described above, can provide additional voltage, frequency, temperature, and/or error data that can be stored in the circuitry 234. As an example, the OTP 216 may be prevented from being written to (as it is a one-time-programmable memory and may have already been written to initially). In this instance, the stored AC scan data can be accessed from another re-programmable memory in order to modify an analysis of the scan data already stored in the voltage-frequency-temperature (VFT) table 232 in the OTP 216. The VFT table 232 storing the scan data can be adjusted based on the additional scan data stored in the circuitry 234 in order to modify a frequency and/or a voltage and/or temperature and minimize and/or attempt to avoid a number of errors in the SoC 210. In some examples, the OTP 216 may be any other memory, such as reprogrammable memory, etc.

Figure 3A:
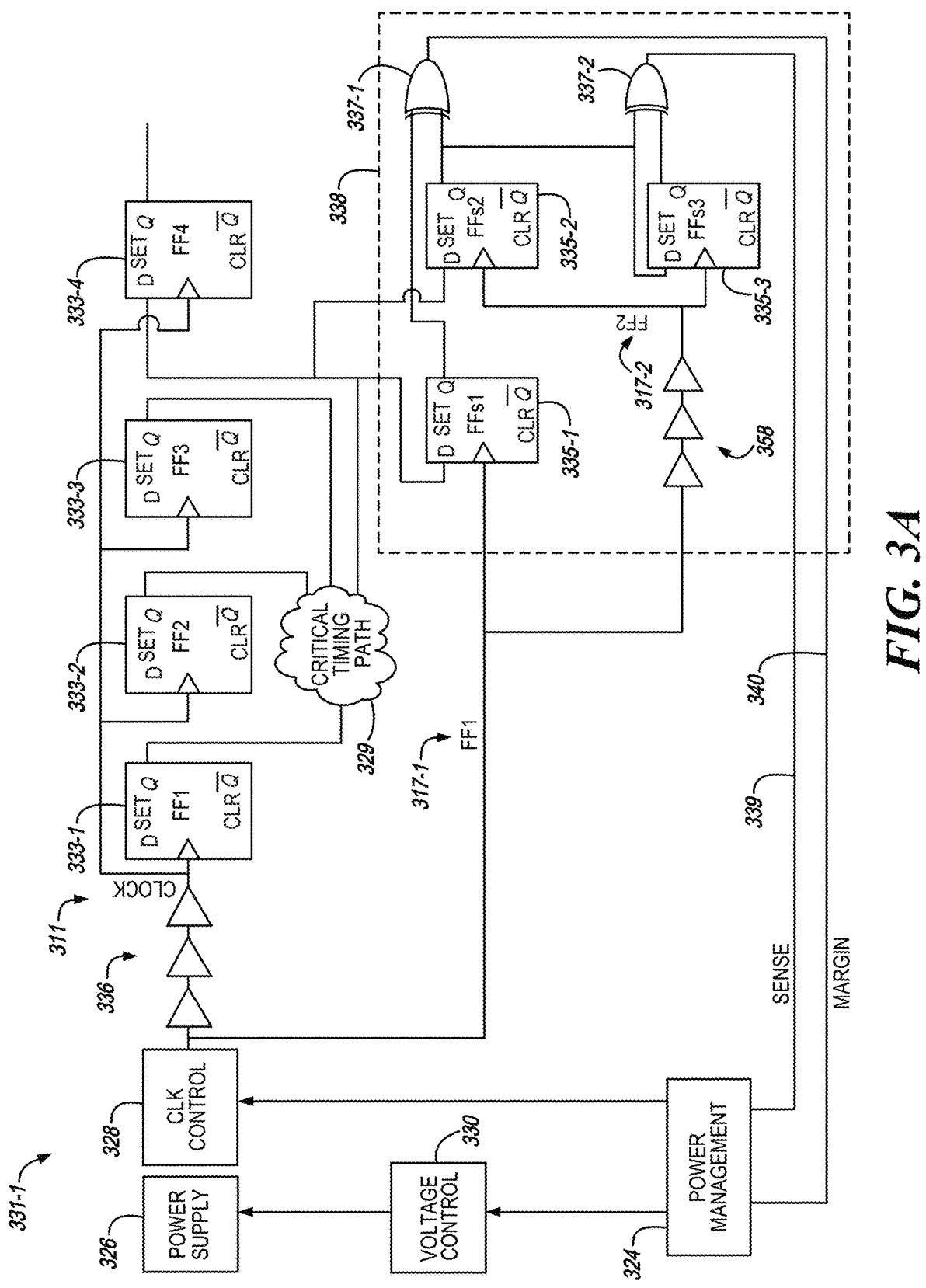
FIGS. 3A-3B each illustrate an example system for critical timing driven adjustable voltage frequency scaling including a sensor in accordance with some embodiments of the present disclosure.

FIG. 3A illustrates an example system 331-1 for critical timing driven adjustable voltage frequency scaling including a sensor 338 in accordance with some embodiments of the present disclosure. The example system 331-1 is an example of using a sensor 338 set to an earlier clock arrival that samples data under more stringent conditions than the functional critical endpoint, which is the endpoint determined by the flip-flop 333-4. This example helps to protect against a marginal setup violation (e.g., timing violation) in the clocking, e.g., clocking frequency, of the system 331-1. During operation, the sensor 338 can capture the data at the data input of flip-flop 333-4. The signals of the sensor 338 can be used by the power management controller 324 to adjust the voltage and/or clocking frequency to operate at a particular efficiency or desired timing.

The system 331-1 can include a power management controller 324. The power management controller 324 can apply dynamic voltage frequency scaling (DVFS) operations using the one-time programmable (OTP) memory 116, the temperature sensor 118, and any other available inputs, as will be described below. The power management controller 324 can be similar to power management controller 124 in FIG. 1. Likewise, the system 331-1 can include a power supply component 326 similar to power supply component 126, a clock control component 328, and a voltage control component 330, clock control component 128, and voltage control component 130 in FIG. 1, respectively. A design unit, such as design unit 122 in FIG. 1, can be controlled by the power management controller 324 through the clock ("CLK") control component 328 and the voltage control component 330 that is in communication with a power supply 326. The voltage control component 330 can control the voltage of the power supply 326 according to instructions received from the power management controller 324. In some examples, the power management controller 324 can be a power management integrated circuitry (PMIC).

A signal from the clock control component 328 can be input to a delay line 336. The delay line 336 can include a number of buffers, inverters and/or other cells, illustrated as three buffers in FIG. 3A, however, examples are not so limited. The delay line 336 can be either fixed or configurable. For example, a portion of a clock tree can be the delay line. Configurable or trimmable delay lines can provide better temperature compensation when paired with a temperature sensor, such as temperature sensor 118 and 218 in FIGS. 1-2B, and design unit, such as design unit 122 and 222 in FIGS. 1-2B.

The example system 331-1, which can be referred to in the alternative as an apparatus, includes a plurality of flip-flops 333-1, 333-2, 333-3, 333-4, 335-1, 335-2, 335-3, which are referred to in the alternative as "latches" 333-1, 333-2, 333-3, 333-4, 335-1, 335-2, 335-3 (which are generally referred to as the "the plurality of flip-flops 333 or 335" or "the plurality of latches 333 or 335," respectively, herein).

As shown in FIG. 3A, the clock control component 328 is coupled to the flip-flops 333-1, 333-2, 333-3, 333-4 through the delay line 336. The clock control component 328 can receive a clock signal from circuitry external to the system 331-1. In some embodiments, a clock signal is asserted through the clock control component 328 to initiate the clock gating logic. In general, the "flip-flops" referred to herein are edge-triggered flip-flops (e.g., flip-flops that are edge-triggered devices that respond to a rising or falling edge of a clocking signal) or level-sensitive flip-flops (e.g., flip-flops that are level-triggered devices that are transparent for a particular clock signal level and opaque for a different clock signal level). While FIG. 3A illustrates the plurality of flip-flops 333, examples are not so limited. For example, the example system 331-1 can include, and operate correctly with, any sequential cell-like latch, such as a flip-flop, register, register file, memory, etc.

Each flip-flop in the plurality of flip-flops 333, 335 has an edge-triggered clock input (illustrated as a sideways triangle), a data "D" input gate, either or both of a "Q" output, and a Q-bar output. As discussed herein, the first of the flip-flops 333-1 can be clocked by the delay line 336 at the clock input of the first flip-flop 333-1. The flip-flop 333-1, in this case through the "Q" or "Q-bar" output, can be a start point of a critical timing path 329. Likewise, the delay line 336 provides a clock to each of the flip-flops 333-2, 333-3, 333-4. Further, each of the flip-flops 333-2, 333-3, in this case through each of the respective "Q" or "Q-bar" outputs, is a start point of the critical timing path 329. The flip-flop 333-4, through the "D" input, can be an end point of the critical timing path 329. The flip-flops 335-1, 335-2 are part of the sensor 338 that senses the end points of the critical timing path 329.

The sensor 338 includes a plurality of flip-flops such as a first flip-flop 335-1 ("FFs1", a second flip-flop 335-2 ("FFs2"), and a third flip-flop 335-3 ("FFs3") (hereinafter referred to collectively as plurality of flip-flops 335), a plurality of XOR gates 337-1, 337-2, and delay line 358. The output from the clock control component 328 can be connected to the clock input to the flip-flop 335-1 and the delay line 358. The output of the delay line 358 can connect to a clock input of each of the flip-flops 335-2 and 335-3. The output from the Q output of flip-flops 335-1 and 335-2 can each be connected to an input to the XOR gate 337-1. Data outputs of flip-flops 335-2 and 335-3 can be connected to inputs of XOR gate 337-2. The output of the XOR gate 337-1 can be connected to an input 340, which indicates a margin status, and the output of the XOR gate 337-2 can be connected to an input 339, which indicates the margin sense occurred. Each of the inputs 340 and 339 can be inputs to the power management controller 324. The clock 311 can be associated with the clock waveform of FIGS. 4-6 (e.g., 411, 511, 611). A clock ("FF1") 317-1 of a first flip-flop 335-1 can be associated with the FF1 clock of FIGS. 4-6 (e.g., 417-1, 517-1, 617-1). A clock ("FF2") 317-2 of a second flip-flop 335-2 can be associated with the FF2 clock of FIGS. 4-6 (e.g., 417-2, 517-2, 617-2).

Figure 3B:
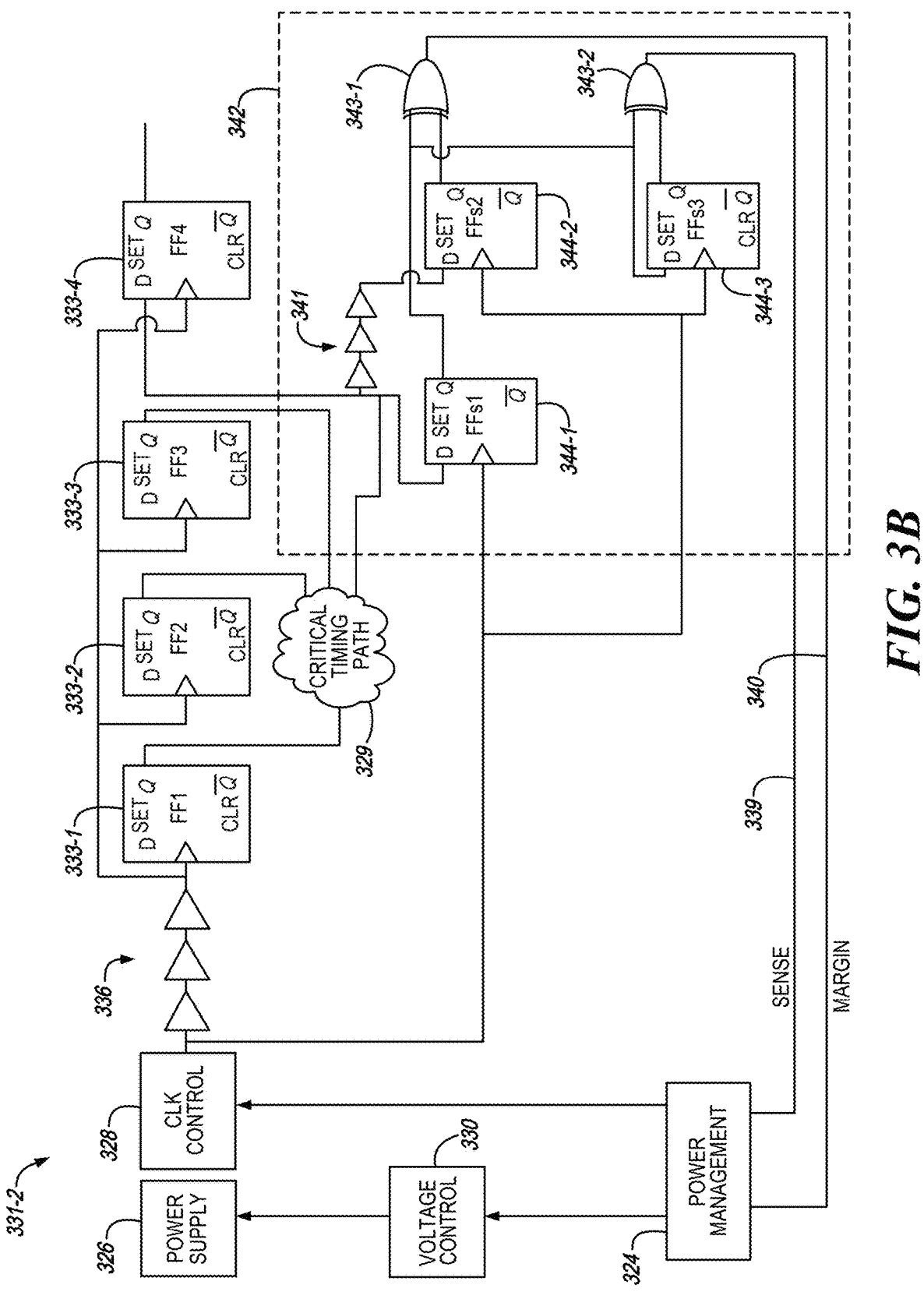

FIG. 3B illustrates an example system 331-2 for critical timing driven adjustable voltage frequency scaling including a sensor 342 in accordance with some embodiments of the present disclosure. The example system 331-2 is also an example of using a sensor 342 set to an earlier clock arrival that samples data under more stringent conditions than the functional critical endpoint, which is the endpoint represented by the flip-flop 333-4. This example helps to protect against a marginal setup violation in the clocking of the system 331-2. During operation, the sensor 342 can capture the data at the data input of flip-flop 333-4. The signals of the sensor 342 can be used by the power management controller 324 to adjust the voltage and/or clocking to operate at a particular efficiency or desired timing.

The system 331-2 can include a power management controller 324. The power management controller 324 can apply dynamic voltage frequency scaling (DVFS) operations using the one-time programmable (OTP) memory 116, the temperature sensor 118, and any other available inputs, as will be described below. The power management controller 324 can be similar to power management controller 124 in FIG. 1. Likewise, the system 331-2 can include a power supply 326 similar to power supply component 126, a clock control component 328, and a voltage control component 330, clock control component 128, and voltage control component 130 in FIG. 1, respectively. A design unit, such as design unit 122 in FIG. 1, can be controlled by the power management controller 324 through the clock ("CLK") control component 328 and the voltage control component 330 that is in communication with a power supply 326. The voltage control component 330 can control the voltage of the power supply 326 according to instructions received from the power management controller 324. In some examples, the power management controller 324 can be a power management integrated circuitry (PMIC).

A signal from the clock control component 328 can be input to a delay line 336. The delay line 336 can include a number of buffers, inverters and/or other cells, illustrated as three buffers in FIG. 3B, however, examples are not so limited. The delay line 336 can be either fixed or configurable. For example, a portion of a clock tree can be the delay line. Configurable or trimmable delay lines can provide better temperature compensation when paired with a temperature sensor, such as temperature sensor 118 and 218 in FIGS. 1-2B, and design unit, such as design unit 122 and 222 in FIGS. 1-2.

The example system 331-2, which can be referred to in the alternative as an apparatus, includes a plurality of flip-flops 333-1, 333-2, 333-3, 333-4, 344-1, 344-2, 344-3, which are referred to in the alternative as "latches" 333-1, 333-2, 333-3, 333-4, 344-1, 344-2, 344-3 (which are generally referred to as the "the plurality of flip-flops 333 or 344" or "the plurality of latches 333 or 344," respectively, herein).

As shown in FIG. 3B, the clock control component 328 is coupled to the flip-flops 333-1, 333-2, 333-3, 333-4 through the delay line 336. The clock control component 328 can receive a clock signal from circuitry external to the system 331-2. In some embodiments, a clock signal is asserted through the clock control component 328 to initiate the clock gating logic. In general, the "flip-flops" referred to herein are edge-triggered flip-flops (e.g., flip-flops that are edge-triggered devices that respond to a rising or falling edge of a clocking signal) or level-sensitive flip-flops (e.g., flip-flops that are level-triggered devices that are transparent for a particular clock signal level and opaque for a different clock signal level).

Each flip-flop in the plurality of flip-flops 333, 344 has an edge-trigger clock input (illustrated as a sideways triangle), a data "D" input, a "Q" or "Q-bar" output. The delay line 336 feeds a clock input to each of the flip-flops 333-1, 333-2, 333-3, 333-4. As discussed herein, the data is sampled by flip-flops 333-1, 333-2 and 333-3. The resulting output of flip-flops 333-1, 333-2 and 333-3, in this case from the "Q" output, is a start point of the critical timing path 329. The flip-flop 333-4 through the "D" input, can be an end point of the critical timing path 329. As illustrated in FIG. 3B, the flip-flops 344-1, 344-2, and 344-3 are part of the sensor 342 for sensing the critical timing path 329.

The sensor 342 includes a plurality of flip-flops such as a first flip-flop 344-1 ("FFs1"), a second flip-flop 344-2 ("FFs2"), and a third flip-flop 344-3 ("FFs3") (hereinafter referred to collectively as plurality of flip-flops 344), a plurality of XOR gates 343-1, 343-2, and delay line 341. The clock output from the clock control component 328 can be connected to a clock input to each of the flip-flops 344-1, 344-2, and 344-3 of the sensor 342. The output from the Q output of flip-flops 344-1 and 344-2 can each be connected to an input to the XOR gate 343-1. An output of flip-flop 344-1 and the output from the Q output of flip-flop 344-3 can be connected to inputs of XOR gate 343-2. The output of the XOR gate 343-1 can be an input 340, associated with a margin, to the power management controller 324 and the output of the XOR gate 344-2 can be an input 339, associated with the sensing, to the power management controller 324.

Figure 4:
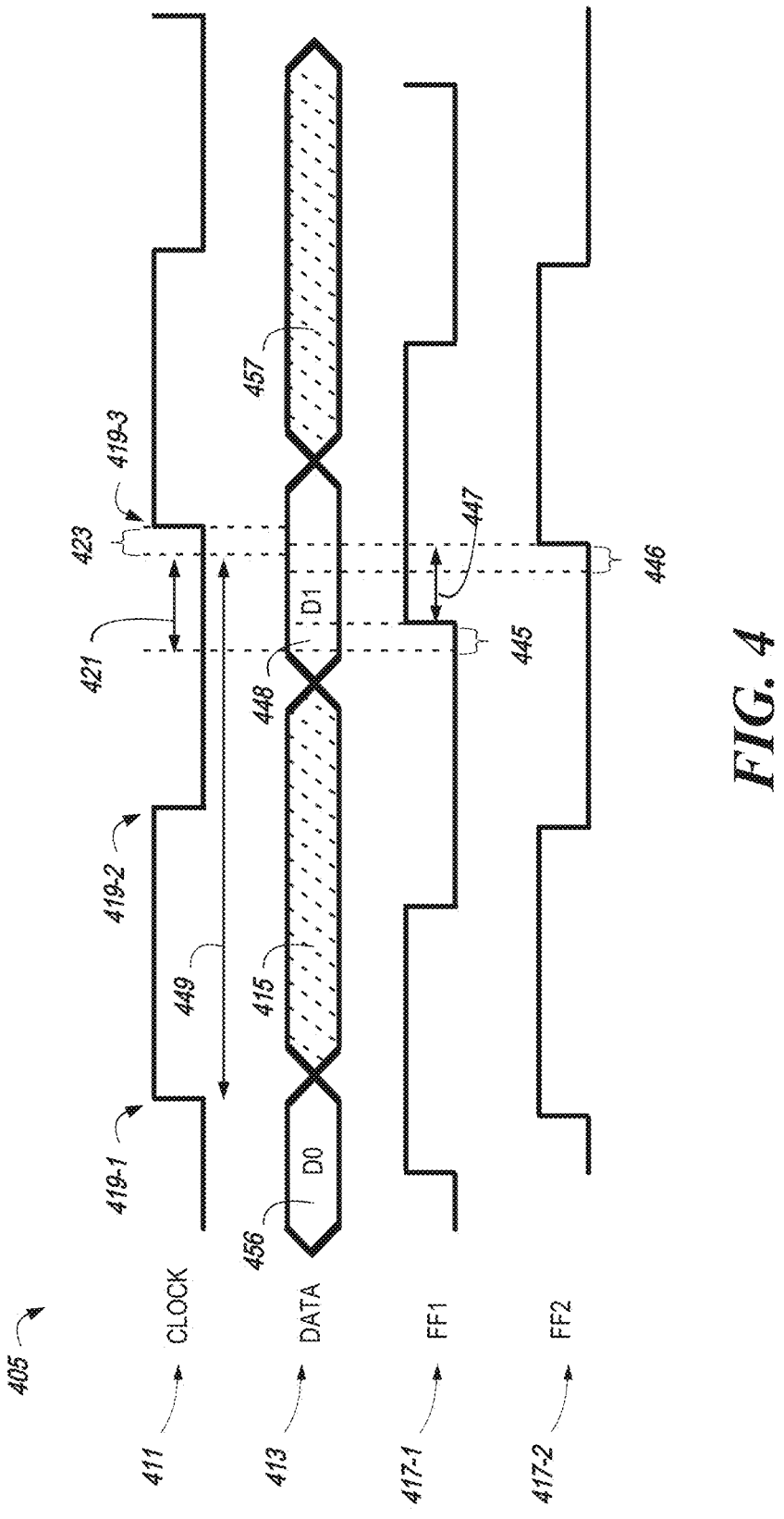
FIGS. 4-7 each illustrated an example timing diagram for critical timing driven adjustable voltage frequency scaling in accordance with some embodiments of the present disclosure.

FIG. 4 illustrates an example timing diagram 405 for critical timing driven adjustable voltage frequency scaling in accordance with some embodiments of the present disclosure. The timing diagram 405 includes waveforms of a clock ("CLOCK") 411, a clock 417-1 of the first flip-flop ("FF1"), a clock 417-2 of the second flip-flop ("FF2") and a critical endpoint data ("DATA") 413. The timing of each of the clock 411, data 413, the clock 417-1 of the first flip-flop, and the clock 417-2 of the second flip-flop is lined up time-wise such that a vertical line crossing each of the waveforms, e.g., a waveform of the clock 411, the clock 417-1 of the first flip-flop ("FF1"), and the clock 417-2 of the second flip-flop ("FF2"), and data 413 would be at a same time. The clock 411 illustrates a rising edge (e.g., rising edges 419-1, 419-3 for the clock 411) and a falling edge (e.g., falling edge 419-2 for clock 411). At the rising edge 419-1, a time window 415 can represent the data as it is seen at the endpoint. During this time window 415, the data may not be valid. The time windows 415 and 457 where data propagates through the critical path and may not be valid can be illustrated by diagonal dotted lines. During this time window the data can change sporadically and therefore may not be stable. Upon completion of the time window 415, a valid data value (e.g., "D1") can be accurately sampled.

To further illustrate the operation of the rising edges, the data 413 includes a first portion 456 (at which a first data value "D0" is valid), a second portion is a time window 415 (a time window of time that the data propagates through the critical path that is being sensed), a third portion 448 (at which a second data value "D1" is stable), and a fourth portion is a window 457 (e.g., a time window when a third data value propagates, which is not illustrated). The propagation time allowance 449 refers to a period of time from the rising edge to the beginning of the next rising edge setup time 423. The reference of D0 and D1 refers to a sequence of data where D0 is the prior data sampled (e.g., a "0" or a "1") and D1 is the subsequently sampled data (e.g., a "0" or a "1") that is being propagated for the next clock. The timing of these rising edges and the timing when the flip-flop input data remains stable is critical to ensuring that the accurate data is sampled by the flip-flop. The second portion is a time window 415 that the data propagates through the critical timing path, such that the data can later be sampled during the third portion 448 (e.g., while the data is "D1").

To sample the proper data, an input to the flip-flop needs to be stable (not changing) for at least a period of time while the data is sampled. For example, the data input must be stable for some small amount of time prior to being sampled by the clock. This amount of time is referred to as setup time. Setup time is the amount of time required for the input to a flip-flop to be stable before a clock edge. Further, hold time is a minimum amount of time required for the input to a flip-flop to remain stable after a clock edge. Hold time is similar to setup time, but refers to events after a clock edge occurs.

As is illustrated in FIG. 4, a first setup time 445 can be associated with sampling using a first flip-flop (e.g., first flip-flop 335-1 in FIG. 3A) and a second setup time 446 can be associated with sampling using a second flip-flop (e.g., second flip-flop 335-2 in FIG. 3A). The first setup time 445 and the second setup time 446 are each within the third portion (e.g., window) 448 and are prior to a third setup time 423 at which the data is actually sampled by a functional flip-flop 333-4. In this way, the data can be sampled by the sensor prior to the actual functional data being sampled to determine what state the data is in and whether a margin at the functional flip-flop (i.e., 333-4) is excessive or optimal. For example, a margin 421 that spans from the beginning of the setup time 445 to the beginning of the data D1 being stable (beginning of the window 448) is an excessive margin since the data doesn't need to be kept stable longer than a functional flip-flop setup time 423 to be sampled accurately. This excessive margin is used, in some previous approaches, in order to cover for a worst case combination of the associated voltage and temperature that may be used and the corresponding delay times of transferring the data associated with those voltages and temperatures. The first and second flip-flops can detect this excessive margin when the first and second flip-flops sample a same data value (e.g., "D1").

In addition, as is illustrated in FIG. 4, a delay 447 indicates an amount of time between the clock edges associated with the first setup time 45 and the second setup time 446 which may be the same as a phase shift between clock edges of the flip-flops 335-1 and 335-2. This phase shift is associated with the delay introduced by the delay line of the sensor 338 and represents the timing delay 447 of the sensor. While the timing delay 447 is measured from a rising edge of the clock 417-1 to a rising edge of the clock 417-2 (which assumes that both the setup times 445 and 446 are equal in length), examples are not so limited. In some other examples, a timing delay may be measured from a respective beginning point of each of two setup times such that setup times with varying lengths may be calculated.

Figure 5:
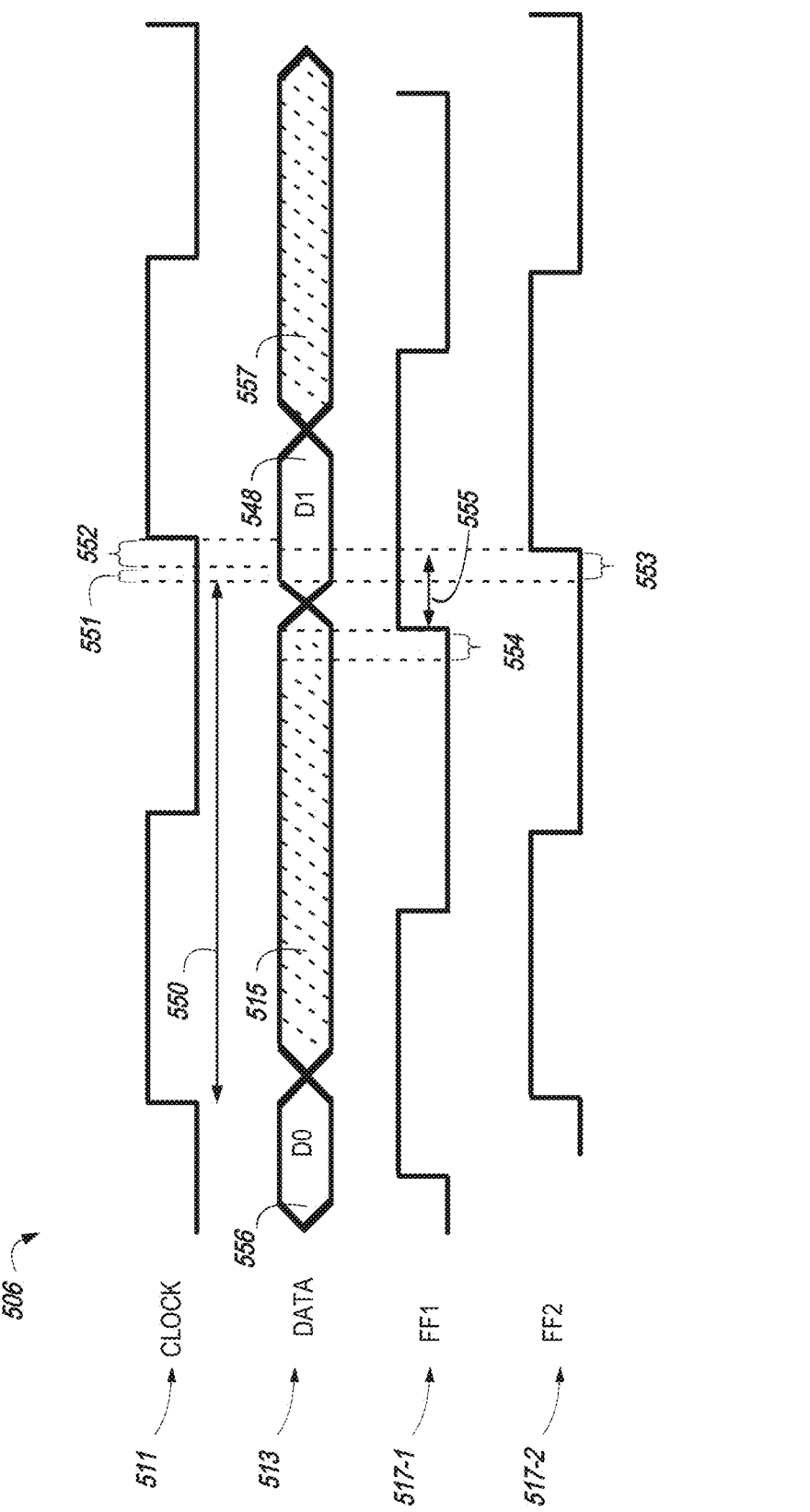
Figure 6:
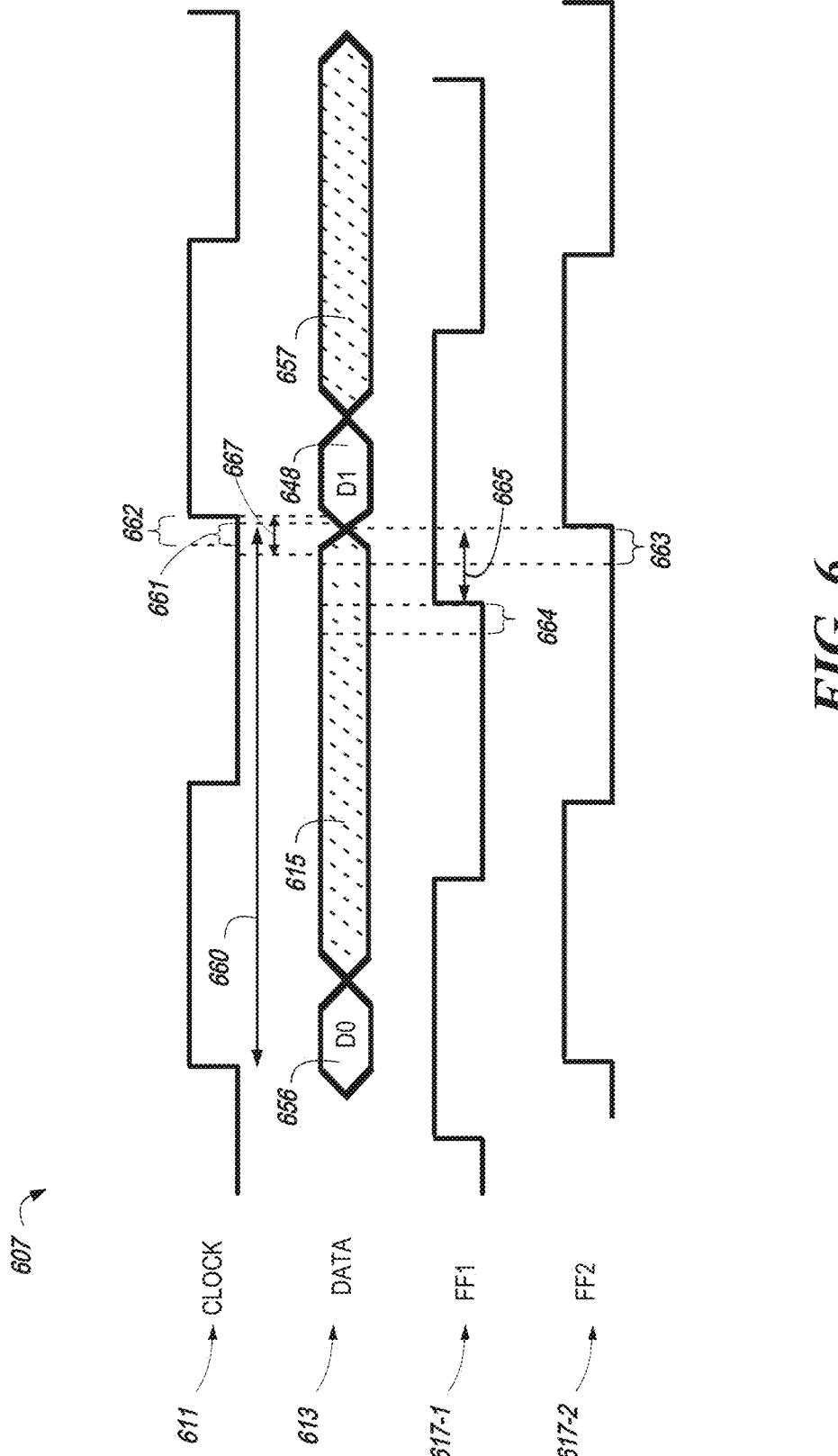

Each of FIGS. 4-6 are associated with a delay line 358 illustrated and described in association with FIG. 3A. As an example, FIGS. 4-6 illustrate a delay line 358 associated with the system of FIG. 3A. FIG. 3B illustrates a system associated with a data delay line 341, which is not correlated to timing diagrams in FIGS. 4-6.

FIG. 5 illustrates an example timing diagram 506 for critical timing driven adjustable voltage frequency scaling in accordance with some embodiments of the present disclosure. The timing diagram 506 includes the waveforms of a clock ("CLOCK") 511, data ("DATA") 513, a clock 517-1 of the first flip-flop clock ("FF1"), and a clock 517-2 of the second flip-flop ("FF2"). The timing of each of the clock 511, the data 513, the clock 517-1 of the first flip-flop, and the clock 517-2 of the second flip-flop are lined up time-wise such that a vertical line crossing each of them would be at a same time. Similar to FIG. 4, each of the waveforms (except for the data) illustrates a rising edge and a falling edge of the clocks.

To further illustrate the operation of the rising edges, the data 513 includes a first portion 556, a second portion 515, a third portion 548, and a fourth portion 557. The first portion 556 is associated with data (e.g., "D0"). At the first rising edge of the clock 511, the data input changes into the second portion 515 that represent an invalid data resulting in different data (indicated by "D1" in the third portion 548 of the waveform of the data 513). The timing of these rising edges and the timing of when the output data is sampled is critical to ensuring that the accurate data is sampled.

As is illustrated in FIG. 5, a first setup time 554 can be associated with sampling using a first flip-flop (e.g., first flip-flop 335-1) and a second setup time 553 can be associated with sampling using a second flip-flop (e.g., second flip-flop 335-2). The first setup time 554 is during the second portion 515 and the second setup time 553 is during the third portion 548. In this way, the data sampled by the first flip-flop can be different than the data sampled by the second flip-flop, indicating that a margin 551 is not excessive. As an example, the margin 551 between the beginning of the third portion 548 and a start of the setup time of the functional flip-flop 333-4 (552), is an optimal margin or at least is not an excessive margin. Put another way, the first and second flip-flops (e.g., 335-1, 335-2, respectively) having different sampled data values indicate that the sensor is sampling around a desired data arrival time. However, this scenario does not address a case when the timing of both the first flip-flop and the second flip-flop is violated and can accidentally result in a false different value, which will be discussed further below. Further, this scenario does not address a case when the timing of a first flip-flop (e.g., flip-flop 335-1) is violated but it samples the same data as a non-violating second flip-flop (e.g., flip-flop 335-2). For this reason, a sense signal can be used to indicate that a sense did not occur. In addition, as is illustrated in FIG. 5, a delay 555 indicates an amount of time between a rising edge of the clock 517-1 and rising edge of the clock 517-2. Further, a critical path maximal delay 550 refers to a period of time from the rising edge of the previous clock to the beginning of the setup time 552 of the next clock. While described in FIGS. 4-6 as having uniform setup times associated with each of the flip-flops, it can be appreciated by one of ordinary skill in the art that the setup times of a respective flip-flop may vary, e.g., depending on the type of the respective flip-flop. As a result, the delay and resultant delay of the sensor may proportionately vary, e.g., depending on a respective setup time of a particular type of flip-flop.

FIG. 6 illustrates an example timing diagram 607 for critical timing driven adjustable voltage frequency scaling in accordance with some embodiments of the present disclosure. The timing diagram 607 include waveforms of a clock ("CLOCK") 611, data ("DATA") 613, a clock 617-1 of a first flip-flop, and a clock 617-2 of a second flip-flop. The waveforms are lined up time-wise such that a vertical line crossing each of them would be at a same time. Similar to FIGS. 4-5, each of the waveforms, e.g., each waveform of the clock 611, the clock 617-1 of the first flip-flop (e.g., first flip-flop 335-1 of FIG. 3A), and the clock 617-2 of the second flip-flop (e.g., second flip-flop 335-2 of FIG. 3A), illustrates a rising edge and a falling edge of the timing diagrams.

To further illustrate the operation of the rising edges, the data 613 includes a first portion 656, a second portion (e.g., window) 615, a third portion 648, and a fourth portion 657. The first portion 656 is associated with a first data value ("D0") and, at the first rising edge of the clock 611, the data input is changed to a second data value (indicated by "D1" in the third portion 648 of the data 613). The timing of these rising edges and the timing of when the output data is sampled is critical to ensuring that the accurate or intended data is sampled.

As is illustrated in FIG. 6, a first setup time 664 can be associated with sampling using a first flip-flop (e.g., flip-flop 335-1) and a second setup time 663 can be associated with sampling using a second flip-flop (e.g., flip-flop 335-2). The first setup time 664 is during the second portion 615 and the second setup time 663 is also during the second portion 615. In this way, the data sampled by the first flip-flop can be the same as the data sampled by the second flip-flop, indicating, in conjunction with the other flip-flop values sampled (which will be described further below) that there is an excessive margin. This sense could lead to a false detection of an excessive margin for sampling or a false optimal margin for sampling. The false optimal margin sampling may be a result of the data toggling during the window 615. This type of false sensing may be avoided by using a power management controller to avoid setting unrealistically low voltage or high frequency settings and using various techniques to avoid it. For example, the power management controller could deploy a filter to eliminate accidental false samplings, or the power management controller could regulate voltage and/or frequency slowly, averaging samplings and avoiding quick crossing of the optimal point into false sense areas. Further, the power management controller could enforce a limit on the voltage and/or frequency that avoids it. The following description associated with FIGS. 7-8 describes an additional flip-flop used to detect and manage such conditions.

In addition, as is illustrated in FIG. 6, a delay 665 indicates an amount of time between a rising edge of the clock 617-1 and rising edge of the clock 617-2. Further, a critical path delay 660 refers to a period of time from the previous rising edge to some point beyond the beginning of setup time 662. This timing represents a setup time 662 being violated, illustrated as timing violation 661 (e.g., which refers to an extent that the critical path delay 600 extends into 662), which can lead to an incorrect data sampled by the flip-flop 333-4. When both flip-flop 335-1 and flip-flop 335-2 are violated, there is a greater risk that flip-flop 333-4 is also violated. Conversely, when employing a duration of time 667 that is equal to the sum of the setup time 662 and an optimal margin (e.g., the optimal margin 551 as shown in FIG. 5), the correct data can be sampled from a flip-flop (e.g., flip-flops 335-1, 335-2).

Figure 7:
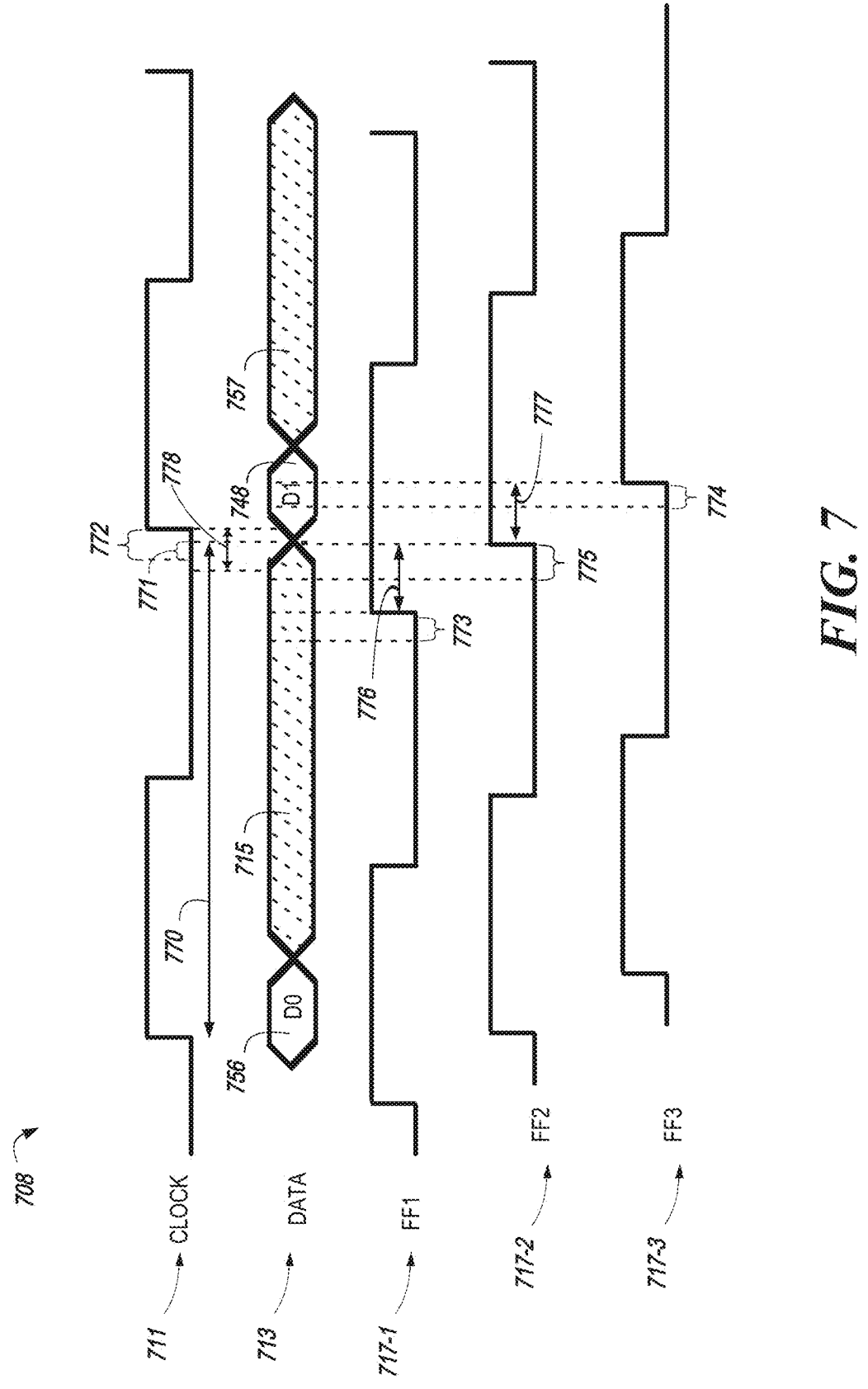

FIG. 7 illustrates an example timing diagram 708 for critical timing driven adjustable voltage frequency scaling in accordance with some embodiments of the present disclosure. A first setup time 773 of the timing diagram 708 can be associated with sampling using a first flip-flop (e.g., flip-flop 882-1), a second setup time 775 can be associated with sensing using a second flip-flop (e.g., flip-flop 882-2), and a third setup time 774 can be associated with using a third flip-flop (e.g., flip-flop 882-3). The first setup time 773 is during the second portion 715 and the second setup time 775 is also during the second portion 715. The third setup time 774 is during the third portion 748. In this way, in this example, the data sampled by the first flip-flop (e.g., flip-flop 882-1) can be the same as the data sampled by the second flip-flop (e.g., flip-flop 882-2) and the data sampled by the third flip-flop (e.g., flip-flop 882-3) can be different than the data sampled by the second flip-flop, indicating there is a timing violation at the input of 833-4. Stated differently, a timing violation can be indicated when there is a difference in the data sampled by the second flip-flop and the data sampled by the third flip-flop.

In addition, as is illustrated in FIG. 7, a first delay 776 indicates an amount of time between a clock rising edge 717-1 of the first flip-flop 882-1 and a clock rising edge 717-2 of the second flip-flop 882-2. A second delay 777 indicates an amount of time between a clock rising edge 717-2 of the second flip-flop 882-2 and a clock rising edge 717-3 of the fourth flip-flop 817-4. Further, a critical path period 770 refers to a period of time from the clock rising edge to beyond the beginning of the setup time 772 of the fourth flip-flop 833-4. This timing represents a setup time 772 being violated, illustrated as timing violation 771, which can lead to an incorrect data sampled by the fourth flip-flop 833-4 (e.g., the fourth flip-flip. Conversely, when employing the a duration of time 778 that is equal to the sum of the setup time 762 and an optimal margin (e.g., the optimal margin 551 as shown in FIG. 5), the correct data can be sampled from a flip-flop (e.g., flip-flops 335-1, 335-2).

As is illustrated in FIG. 7, the timing diagrams 708 includes waveforms including a clock ("CLOCK") 711, data ("DATA") 713, a clock 717-1 of a first flip-flop ("FF1"), a clock 717-2 of a second flip-flop ("FF2"), and a clock 717-3 of a third flip-flop ("FF3"). The timing of each of the waveforms, e.g., waveform of the clock 711, the clock 717-1 of the first flip-flop ("FF1"), the clock 717-2 of the second flip-flop ("FF2"), and the clock 717-3 of the third flip-flop ("FF3") and the data 713, are lined up time-wise such that a vertical line crossing each of them would be at a same time. Similar to FIGS. 4-6, each of the waveforms, e.g., waveform of the clock 711, the clock 717-1 of the first flip-flop ("FF1"), the clock 717-2 of the second flip-flop ("FF2"), and the clock 717-3 of the third flip-flop ("FF3"), illustrates a rising edge and a falling edge of the clocks.

To further illustrate the operation of the rising edges, the data 713 includes a first portion 756, a second portion 715, a third portion 748, and a fourth portion 757. The first portion 756 is associated with a first data value ("D0") and, at the first rising edge of the clock 711, the data input is changed (indicated by "D1" in the third portion 748 of the data 713). The timing of these rising edges and the timing of when the output data is sampled is critical to ensuring that the accurate data is being sampled.

Figure 8:
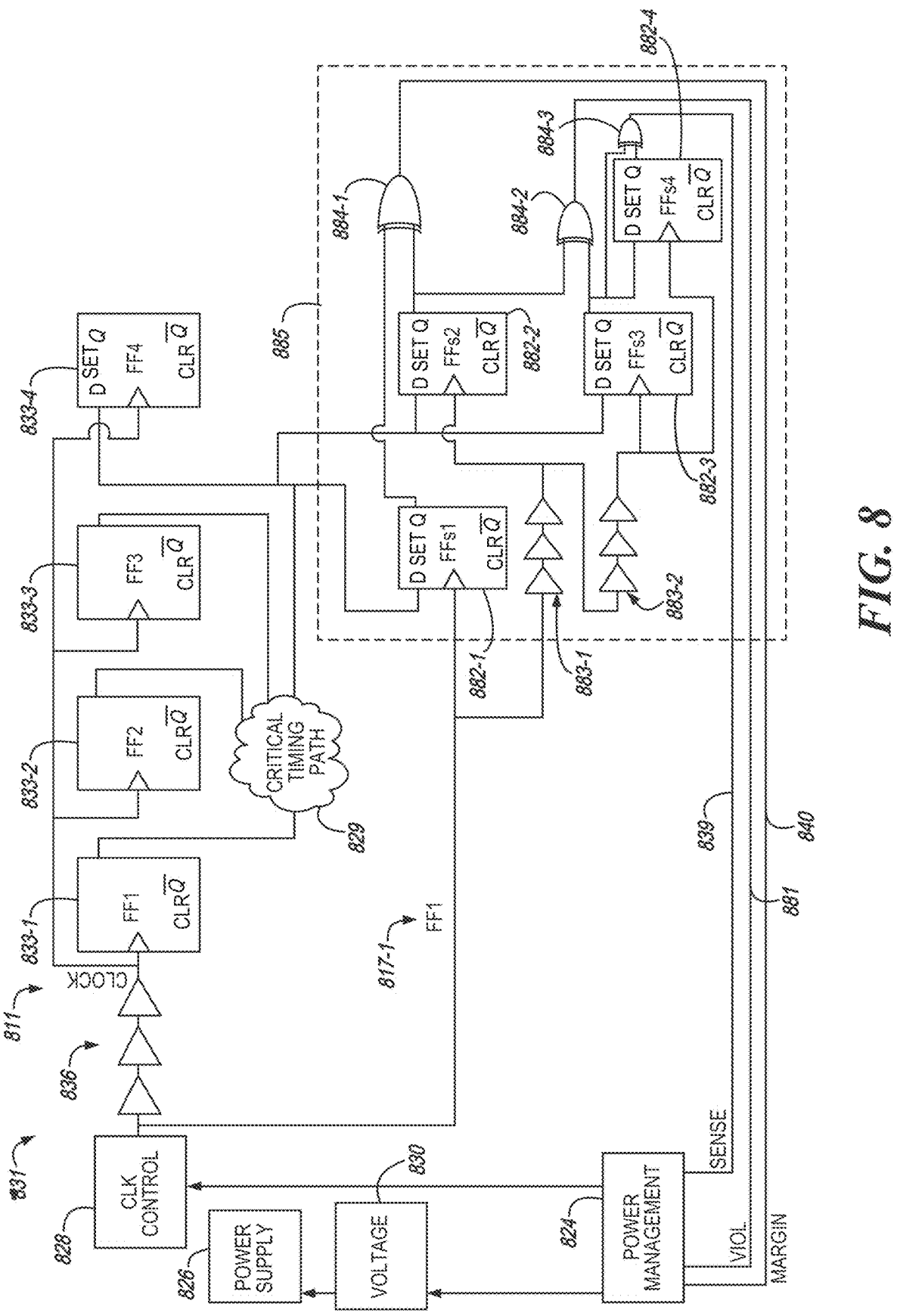
FIG. 8 illustrates an example system for critical timing driven adjustable voltage frequency scaling including a sensor in accordance with some embodiments of the present disclosure.

The following Table 1 demonstrates examples of the data values of the flip-flops and corresponding determinations based on those sampled data values associated with various embodiments including the embodiments described in FIG. 7 and FIG. 8. The first ("FFs1") flip-flop can be configured to determine whether a margin is excessive, the second ("FFs2") and third ("FFs3") flip-flops can be used to determine whether a violation has occurred, the fourth (FFs4") flip-flop can be configured to determine whether a sense operation has occurred and whether the result of the sense operation is valid. For instance, the fourth flip-flop may be configured to change a data state responsive to the occurrence of a sense operation (e.g., responsive to a sense operation that is valid). Table 1 is shown as a non-limiting example, however; other configurations (e.g., employing different signal combinations and/or different outcomes based on the signal combinations, etc.) are possible. For instance, Table 2 shows another non-limiting example examples of the data values of the flip-flops and corresponding determinations based on those sampled data values associated with various embodiments including the embodiments described in FIG. 3A and FIG. 3B.

As shown in Table 1 and 2, an "active" designation can refer to when a sense operation has occurred and the result of the sense operation is valid. Conversely, an "inactive" designation can refer to when a sense operation has not occurred (e.g., a state of the fourth flip-flop has not changed). As mentioned, the timing violation is determined by a comparison between the $2^{nd}$ flip-flop and the $3^{rd}$ flip-flop.

TABLE 1

| FFs1 | FFs2 | FFs3 | FFs4 | Violation | Margin | Sense | Result |
|------|------|------|------|-----------|-----------|----------|-----------|
| 0 | 0 | 0 | 0 | Clear | Excessive | Inactive | Inactive |
| 0 | 0 | 0 | 1 | Clear | Excessive | Active | Excessive |
| 0 | 0 | 1 | 0 | Violation | Excessive | Active | Violation |
| 0 | 0 | 1 | 1 | Violation | Excessive | Inactive | Inactive |
| 0 | 1 | 0 | 0 | Violation | Optimal | Inactive | Inactive |
| 0 | 1 | 0 | 1 | Violation | Optimal | Active | Violation |
| 0 | 1 | 1 | 0 | Clear | Optimal | Active | Optimal |
| 0 | 1 | 1 | 1 | Clear | Optimal | Inactive | Inactive |
| 1 | 0 | 0 | 0 | Clear | Optimal | Inactive | Inactive |
| 1 | 0 | 0 | 1 | Clear | Optimal | Active | Optimal |
| 1 | 0 | 1 | 0 | Violation | Optimal | Active | Violation |
| 1 | 0 | 1 | 1 | Violation | Optimal | Inactive | Inactive |
| 1 | 1 | 0 | 0 | Violation | Excessive | Inactive | Inactive |
| 1 | 1 | 0 | 1 | Violation | Excessive | Active | Violation |
| 1 | 1 | 1 | 0 | Clear | Excessive | Active | Excessive |
| 1 | 1 | 1 | 1 | Clear | Excessive | Inactive | Inactive |

TABLE 2

| FFs1 | FFs2 | FFs3 | Margin | Sense | Result |
|------|------|------|-----------|----------|-----------|
| 0 | 0 | 0 | Excessive | Inactive | Inactive |
| 0 | 0 | 1 | Excessive | Active | Excessive |
| 0 | 1 | 0 | Optimal | Active | Optimal |
| 0 | 1 | 1 | Optimal | Inactive | Inactive |
| 1 | 0 | 0 | Optimal | Inactive | Inactive |
| 1 | 0 | 1 | Optimal | Active | Optimal |
| 1 | 1 | 0 | Excessive | Active | Excessive |
| 1 | 1 | 1 | Excessive | Inactive | Inactive |

FIG. 7 is an example timing diagram 708 described in association with a system 831 of FIG. 8. As an example, FIG. 7 illustrates a clock delay associated with the system of FIG. 8. The clock 811 can be associated with the clock waveform of FIG. 7 (e.g., 711). A clock of a first flip-flop 882-1 ("FFs1") can be analogous to the clock ("FF1") of the first flip-flop of FIG. 7 (e.g., 717-1). A clock of a second flip-flop 882-2 ("FFs2") can be analogous to the clock ("FF2") of the second flip-flop of FIG. 7 (e.g., 717-2). A clock of a third flip-flop 882-3 ("FFs3") can be analogous to the clock of the third flip-flop of FIG. 7 (e.g., 717-3).

FIG. 8 illustrates an example system 831 for critical timing driven adjustable voltage frequency scaling including a sensor 885 in accordance with some embodiments of the present disclosure. The example system 831 is an example of using a sensor 885 set to an earlier clock arrival that samples data under more stringent conditions than the functional critical endpoint, which is the endpoint determined by the flip-flop 833-4. Further, the example system 831 demonstrates the inclusion of the additional flip-flop described in association with FIG. 7. This example system 831, along with the other embodiments herein, mitigates/avoids false margin sensing (e.g., accidental false margin sensing, as mentioned above). During operation, the sensor 885 can capture the data at the data input of flip-flop 833-4. The signals of the sensor 885 can be used by the power management controller 824 to adjust the voltage and/or clocking to operate at a particular efficiency or desired timing.

The system 831 can include a power management controller 824. The power management controller 824 can apply dynamic voltage frequency scaling (DVFS) operations using the one-time programmable (OTP) memory 116, the temperature sensor 118, and any other available inputs, as will be described below. The power management controller 324 can be similar to power management controller 124 in FIG. 1. Likewise, the system 831 can include a power supply 826, similar to power supply component 126 and 326 in FIGS. 1 and 3A-B, a clock control component 828, and a voltage control component 830 similar to clock control component 128, and voltage control component 130 in FIG. 1, respectively. A design unit, such as design unit 122 in FIG. 1, can be controlled by the power management controller 824 through the clock ("CLK") control component 828 and the voltage control component 830 that is in communication with a power supply 826. The voltage control component 830 can control the voltage of the power supply 826 according to instructions received from the power management controller 824. In some examples, the power management controller 824 can be a power management integrated circuitry (PMIC).

A signal from the clock control component 828 can be connected to an input to a delay line 836. The delay line 836 can include a number of buffers, inverters and/or other cells, illustrated as three buffers in FIG. 8, however, examples are not so limited. The delay line 836 can be either fixed or configurable. For example, a portion of a clock tree can be the delay line. Configurable or trimmable delay lines can provide better temperature compensation when paired with a temperature sensor, such as temperature sensor 118 and 218 in FIGS. 1-2B, and design unit, such as design unit 122 and 222 in FIGS. 1-2B.

The example system 831, which can be referred to in the alternative as an apparatus, includes a plurality of flip-flops 833-1, 833-2, 833-3, 833-4, 882-1, 882-2, 882-3, 882-4, which are referred to in the alternative as "latches" 833-1, 833-2, 833-3, 833-4, 882-1, 882-2, 882-3, 882-4 (which are generally referred to as the "the plurality of flip-flops 833 or 882" or "the plurality of latches 833 or 882," respectively, herein).

As shown in FIG. 8, the clock control component 828 is coupled to the flip-flops 833-1, 833-2, 833-3, 833-4 through the delay line 836. The clock control component 828 can receive a clock signal from circuitry external to the system 831. In some embodiments, a clock signal is asserted through the clock control component 828 to initiate the clock gating logic. In general, the "flip-flops" referred to herein are edge-triggered flip-flops (e.g., flip-flops that are edge-triggered devices that respond to a rising or falling edge of a clocking signal) or level-sensitive flip-flops (e.g., flip-flops that are level-triggered devices that are transparent for a particular clock signal level and opaque for a different clock signal level). While FIG. 8 illustrates the plurality of flip-flops 833, examples are not so limited. For example, the example system 831 can include, and operate correctly with, any sequential cell-like latch, such as a flip-flop, register, register file, memory, etc.

Each flip-flop in the plurality of flip-flops 833, 882 has an edge-trigger clock input (illustrated as a sideways triangle), a data "D" input gate, either or both of a "Q" output gate, and a Q-bar output gate. As discussed herein, the first of the flip-flops 833-1 can be clocked by the delay line 836 at the clock input of the first flip-flop 833-1. The flip-flop 833-1, in this case through the "Q" or "Q-bar" output, can be a start point of the critical timing path 829. Likewise, the delay line 836 provides a clock to each of the flip-flops 833-2, 833-3, 833-4. Further, each of the flip-flops 833-2, 833-3, in this case from each of the respective "Q" or "Q-bar" outputs, is a start point of the critical timing path 829. The flip-flop 833-4, through the "D" input, can be an end point of the critical timing path 829. The flip-flops 882-1, 882-2, 882-3, 882-4 are part of the sensor 885.

The sensor 885 includes a plurality of flip-flops such as a first flip-flip 882-1 ("FFs1"), a second flip-flip 882-2 ("FFs2"), a third flip-flop 882-3 ("FFs3"), and a fourth flip-flop 882-4 ("FFs4") (hereinafter referred to collectively as plurality of flip-flops 882), a plurality of XOR gates 884-1, 884-2, 884-3 and a first delay line 883-1 and a second delay line 883-2. The output from the clock control component 828 can be connected to an input to the flip-flop 882-1 and the delay line 883-1. The output of the delay lines 883-1 can connect to a clock input of the flip-flop 882-2. An output from the first delay line 883-1 can be connected to an input to the second delay line 883-2. An output from the second delay line 883-2 can connect to a clock input to flip-flop 882-3 and 882-4. The output from the Q outputs of flip-flops 882-1 and 882-2 can each be connected to an input to the XOR gate 884-1. A Q data output of flip-flop 882-2 and a Q data output of flip-flop 882-3 can be connected to inputs of XOR gate 884-2. The Q data output of flip-flop 882-3 and the Q data output of flip-flop 882-4 can be connected to inputs to XOR gate 884-3. The output of the XOR gate 884-1 can be connected to an input ("MARGIN") 840, which indicates a margin status, the output of the XOR gate 884-2 can be connected to an input ("VIOL") 881, which indicates a timing violation status, and the XOR gate 884-3 can be connected to an input ("SENSE") 839, which indicates a margin sense occurred. Each of the inputs 840, 881, and 839 can be connected to the power management controller 824.

FIG. 9 illustrates an example method 909 for critical timing driven adjustable voltage frequency scaling in accordance with some embodiments of the present disclosure. The method 909 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 990, the method 909 can include performing a plurality of sensing operations on a system on chip (SoC) at a respective plurality of time windows each associated with a particular data value. In a digital logic circuit, a sensing operation is when a circuit component detects and responds to a particular digital signal on a wire or a specific voltage level on a logic gate input. Sensing can be performed by several components in a circuit including registers, flip-flops, latches, and other types of elements. Sensing operations may be used in digital circuits to control the behavior of the circuit, allowing the circuit to perform specific tasks, such as decision-making, memory storage, and state control. Overall, a sensing operation is an important part of digital logic circuits, allowing circuit components to detect and respond to specific signals, making it possible to perform the desired task. Thus, in some examples described herein, at least one of the plurality of sensing operations is associated with a sensor set to an earlier clock arrival in relation to at least another of the plurality of sensing operations. In some examples, at least one of the plurality of sensing operations is associated with a sensor set to a later data arrival in relation to at least another of the plurality of sensing operations. In some examples, the plurality of sensing operations can determine a particular data value stored in a location of data storage elements, e.g., a flip-flop or latch of a system on chip (SoC).

At block 992, the method 909 can include comparing at least two of the particular data values associated with at least two respective time windows of the plurality of time windows. As an example, a first sensing operation can be performed during a first time window associated with a clock cycle of a system on chip (SoC) and a second sensing operation can be performed during a second time window associated with the clock cycle. The first time window and the second time window can be offset by a particular amount of clock or data timing. A data value sensed during the first sensing operation can be compared to a data value sensed during the second sensing operation. In response to the comparison, a voltage and/or a frequency can be adjusted in order to adjust a margin of the plurality of sensing circuits. The margin can be adjusted such that a setup time and/or a hold time is adjusted such that a sampled data value is accurate or correct and the setup time and/or hold time is optimal (e.g., the margin is not insufficient and the margin is not excessive). For instance, in some embodiments a sampled value of a fourth flip may be employed to determine whether or not the margin is insufficient and another sampled value of a different flip-flop (e.g., a first flip-flop, a second flip-flop, and/or a third flip-flop) can be employed to determine whether or not the margin is excessive. In this way, the approaches herein can identify whether the margin is optimal or whether the margin is not optimal (e.g., is excessive or insufficient).

At block 994, the method 909 can include, in response to the at least two of the particular data values being a same data value, determining that a clock margin is above a threshold clock margin. Responsive to determining that the clock margin is above the threshold clock margin, a clocking of the SoC may be adjusted, a voltage associated with at least one operation of the SoC may be adjusted, a frequency of at least one operation of the SoC may be adjusted, or any combination thereof. For instance, in response to determining that the clock margin is above the threshold clock margin, the method 909 can include taking a remedial action. Examples of remedial actions include adjusting a voltage associated with at least one operation of the SoC, adjusting a frequency of at least one operation of the SoC, logging or otherwise storing a record of the occurrence of the clock margin being not optimal (e.g., being excessive or insufficient), and/or altering a mode of operation of the SoC such as activating a safety or security protection mechanism such as those that are intended to prevent data corruption, a security breach and/or improper operation of the SoC, among other possibilities. For instance, in some embodiments, a voltage and/or a frequency of the at least one operation of the SoC can be adjusted responsive to a determination that the claim margin is above the threshold clock margin.

At block 996, the method 909 can include, in response to the at least two of the particular data values being different data values, determining that a clock margin is below a threshold clock margin. In some examples, the method 909 can include, in response to determining that the clock margin is below the threshold clock margin, maintaining a same clocking of the SoC. Stated differently, in response to a determination that the clock margin is less than the threshold clock margin, the clocking of the SoC can be maintained (e.g., the clocking of the SoC is not modified).

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
performing a plurality of sensing operations on a system on chip (SoC) at a respective plurality of time windows, wherein each time window of the plurality of time windows is associated with a particular data value;
comparing at least two of the particular data values associated with at least two respective time windows of the plurality of time windows;
in response to the at least two of the particular data values being a same data value, determining that a clock margin is above a threshold clock margin; and
in response to the at least two of the particular data values being different data values, determining that a clock margin is below a threshold clock margin.

2. The method of claim 1, further comprising, in response to determining that the clock margin is above the threshold clock margin, adjusting a clocking of the SoC.

3. The method of claim 1, further comprising, in response to determining that the clock margin is below the threshold clock margin, maintaining a same clocking of the SoC.

4. The method of claim 1, further comprising, in response to determining that the clock margin is above the threshold clock margin, adjusting a voltage of at least one operation of the SoC.

5. The method of claim 1, further comprising, in response to determining that the clock margin is above the threshold clock margin, adjusting a clocking frequency of at least one operation of the SoC.

6. The method of claim 1, further comprising, in response to determining that the clock margin is above the threshold clock margin, adjusting a voltage and a clocking frequency of at least one operation of the SoC.

7. The method of claim 1, wherein at least one of the plurality of sensing operations is associated with a sensor set to an earlier clock arrival in relation to at least another of the plurality of sensing operations.

8. The method of claim 1, wherein at least one of the plurality of sensing operations is associated with a sensor set to a later data arrival in relation to at least another of the plurality of sensing operations.

9. An apparatus, comprising:
a controller configured to:
    perform a plurality of sensing operations on a system on chip (SoC) at a respective plurality of time windows, wherein each time window of the plurality of time windows is associated with a particular data value;
    compare at least two of the particular data values associated with at least two respective time windows of the plurality of time windows;
    in response to the at least two of the particular data values being a same data value, determine that a clock margin is above a threshold clock margin; and
    in response to the at least two of the particular data values being different data values, determine that a clock margin is below a threshold clock margin.

10. The apparatus of claim 9, further comprising a sensor to perform the plurality of sensing operations.

11. The apparatus of claim 10, wherein the sensor comprises a plurality of delay lines and a plurality of flip-flops.

12. The apparatus of claim 11, wherein at least one of the plurality of delay lines is configured to permit a data value on at least one flip-flip of the plurality of flip-flops to be sampled during a particular time window associated with a timing violation.

13. The apparatus of claim 10, wherein the sensor comprises a plurality of gates.

14. The apparatus of claim 10, wherein a voltage associated with the SoC is adjusted based on the plurality of sensing operations performed by the sensor.

15. The apparatus of claim 9, further comprising a plurality of sensors, wherein each of the plurality of sensors is associated with at least one of the plurality of time windows to determine the clock margin.

16. The apparatus of claim 9, wherein the controller is configured to use an earlier clock arrival to perform the plurality of sensing operations.

17. The apparatus of claim 9, wherein the controller is configured to use an later data arrival to perform the plurality of sensing operations.

18. An apparatus, comprising:
a controller;
a voltage control component coupled to the controller; and
a clock control component coupled to the controller;
wherein the controller is configured to:
    perform a plurality of sensing operations on a system on chip (SoC) at a respective plurality of time windows, wherein each time window of the plurality of time windows is associated with a particular data value;
    compare at least two of the particular data values associated with at least two respective time windows of the plurality of time windows;
    in response to the at least two of the particular data values being a same data value, determine that a clock margin is above a threshold clock margin and perform a remedial action; and
    in response to the at least two of the particular data values being different data values, determine that a clock margin is below a threshold clock margin perform a remedial action.

19. The apparatus of claim 18, wherein the controller is configured to sense the at least two of the particular data values from respective flip-flops of a plurality of flip-flops.

20. The apparatus of claim 19, wherein the plurality of flip-flops include at least three flip-flops.

* * * * *